US006235436B1

(12) United States Patent
Hirano et al.

(10) Patent No.: US 6,235,436 B1
(45) Date of Patent: May 22, 2001

(54) SEMICONDUCTOR DEVICE USING POSITIVE PHOTOSENSITIVE RESIN COMPOSITION AND PROCESS FOR PREPARATION THEREOF

(75) Inventors: Takashi Hirano; Toshio Banba; Hiroaki Makabe; Naoshige Takeda; Toshiro Takeda, all of Utsunomiya (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/442,277

(22) Filed: Nov. 17, 1999

Related U.S. Application Data

(63) Continuation of application No. 08/854,863, filed on May 12, 1997, now Pat. No. 6,071,666.

(30) Foreign Application Priority Data

| May 31, 1996 | (JP) | 8-138593 |
| May 13, 1996 | (JP) | 8-117387 |
| Jun. 20, 1996 | (JP) | 8-159679 |
| Jun. 25, 1996 | (JP) | 8-164472 |
| Jun. 28, 1996 | (JP) | 8-169319 |

(51) Int. Cl.$^7$ .............................. G03F 7/30; G03F 7/40
(52) U.S. Cl. .......................... 430/18; 430/320; 430/326; 430/330; 430/906
(58) Field of Search .............................. 430/18, 320, 326, 430/330, 906

(56) References Cited

U.S. PATENT DOCUMENTS

| 2,772,972 | 12/1956 | Herrick | 430/14 |
| 2,797,213 | 6/1957 | Moore | 534/557 |
| 3,669,658 | 6/1972 | Yonezawa et al. | 430/191 |
| 3,755,354 | 8/1973 | Holub et al. | 548/406 |
| 4,339,521 | * 7/1982 | Ahne et al. | 430/192 |
| 4,460,739 | 7/1984 | Ashby | 524/702 |
| 4,927,736 | 5/1990 | Mueller et al. | 430/192 |
| 5,104,768 | 4/1992 | Sassmannhausen et al. | 430/192 |
| 5,288,588 | 2/1994 | Yukawa et al. | 430/192 |
| 5,449,584 | 9/1995 | Banba et al. | 430/192 |
| 5,585,217 | 12/1996 | Oba | 430/192 |

FOREIGN PATENT DOCUMENTS

| 0 023 662 | 2/1981 | (EP) . |
| 0 291 779 | 11/1988 | (EP) . |
| 9 459 395 | 12/1991 | (EP) . |
| 4162552 | 12/1979 | (JP) . |
| 1-215869 | 8/1989 | (JP) . |
| 1-046862 | 10/1989 | (JP) . |
| 3-200251 | 9/1991 | (JP) . |
| 3-200252 | 9/1991 | (JP) . |
| 3-200253 | 9/1991 | (JP) . |
| 3-200254 | 9/1991 | (JP) . |
| 4-001650 | 1/1992 | (JP) . |
| 4-001651 | 1/1992 | (JP) . |
| 4-011260 | 1/1992 | (JP) . |
| 4-011356 | 1/1992 | (JP) . |
| 4-012357 | 1/1992 | (JP) . |

\* cited by examiner

*Primary Examiner*—John S. Chu
(74) *Attorney, Agent, or Firm*—Browdy and Neimark

(57) ABSTRACT

A positive type photosensitive resin composition which comprises (A) 100 parts by weight of a polyamide represented by the general formula (1):

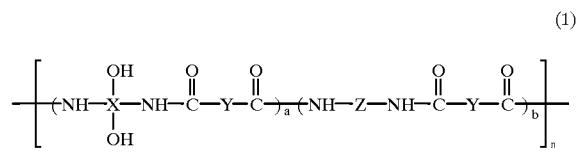

(1)

wherein X represents a tetravalent aromatic group; Y represents a divalent aromatic group; Z represents a divalent group represented by the formula:

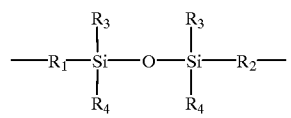

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, (B) 1 to 100 parts by weight of a photosensitive diazoquinone compound and (C)1 to 50 parts by weight of a phenol compound represented by a specific structural formula and/or (D) 0.1 to 20 parts by weight of an organosilicon compound represented by a specific structural formula; and a semiconductor device in which a pattern of a polybenzoxazole resin obtained by using the above photosensitive resin composition is formed in a thickness of 0.1 to 20 μm on a semiconductor element.

24 Claims, No Drawings

SEMICONDUCTOR DEVICE USING POSITIVE PHOTOSENSITIVE RESIN COMPOSITION AND PROCESS FOR PREPARATION THEREOF

CROSS-REFERENCE TO RELATED APPLICATIONS

This is a continuing application of parent application Ser. No. 08/854,863, filed May 12, 1997, now U.S. Pat. No. 6,071,666.

BACKGROUND OF THE INVENTION

1. Field of the Invention

This invention relates to a positive type photosensitive resin composition which has a high sensitivity, can give a pattern with a high yield of residual film thickness and is excellent in adhesion to an encapsulating resin and a substrate, and to a semiconductor device provided with a film which is formed from the above positive type photosensitive resin composition and which relaxes the impact due to the working of molding a resin during encapsulating and also relaxes the stress caused in various thermal histories after the molding.

2. Description of Related Art

Polyimide resins having excellent heat resistance, excellent electrical characteristics and excellent mechanical characteristics have heretofore been used for a surface-protecting film of a semiconductor element and an interlaminar insulation film of a semiconductor element. Recently, however, a remarkable enhancement of heat cycle resistance, thermal shock resistance and the like have been required because of the high integration and largening of a semiconductor element, the thinning and miniaturization of an encapsulating resin package, the transfer to surface mounting by a solder reflow and the like, and hence, a polyimide resin having higher performances has become required.

On the other hand, the spotlight of attention is now being focused on a technique of imparting photosensitivity to a polyimide resin itself, and the polyimide resin to which photosensitivity has been imparted by the technique include, for example, those represented by the following formula (16) and the like:

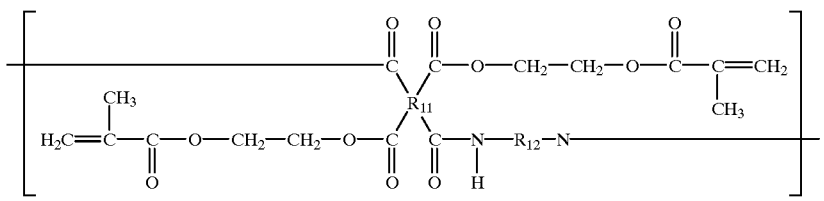

(16)

wherein $R_{11}$ is

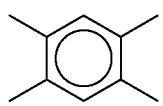

and $R_{12}$ is

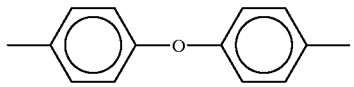

When these polyimide resins are used, a part of the pattern-forming step can be simplified and they have an effect of shortening the step. However, in the development step, a solvent such as N-methyl-2-pyrrolidone or the like becomes necessary, so that the use of the above polyimides has a problem in respects of safety and handling. Recently, therefore, there has been developed a positive type photosensitive resin which can be subjected to development with an aqueous alkali solution. For example, JP-B-1-46,862 discloses a positive type photosensitive resin composed of a polybenzoxazole resin and a diazoquinone compound or of a polybenzoxazole precursor and a diazoquinone compound. This photosensitive resin has high heat resistance, excellent electrical characteristics and fine processing properties and also has a possibility of use as not only a wafer coating resin but also an interlaminar insulation resin.

In the development mechanism of the above positive type photosensitive resin, the diazoquinone compound in the unexposed portion is insoluble in an aqueous alkali solution and causes, when exposed to light, a chemical reaction to become soluble in an aqueous alkali solution, and the utilization of this difference in solubility between the exposed portion and the unexposed portion makes it possible to prepare a coating film pattern composed of only the unexposed portion.

When such a photosensitive resin is actually used, the sensitivity of the photosensitive resin particularly becomes a problem. When the sensitivity is low, the exposure time per one sheet of wafer becomes long, and the throughput becomes low. Therefore, when, for example, the molecular weight of the polybenzoxazole resin as the base resin is made small for the purpose of enhancing the sensitivity of the photosensitive resin, there are caused such problems that the film loss of the unexposed portion during the development becomes large and the pattern shape becomes bad.

Moreover, the adhesion between the photosensitive resin and the encapsulating resin is bad, and delamination is caused at the interface therebetween, so that there is a problem in practical use. Hence, a photosensitive resin having much better adhesion to the encapsulating resin has become strongly demanded.

Furthermore, in the case of the above positive type photosensitive resin, the removal of the resin in the via hole portion is effected using an alkaline aqueous solution, so that no organic solvent is required unlike other conventional photosensitive polyimide resins and hence the safety of working is further increased.

However, the above photosensitive polybenzoxazole precursor is inferior in adhesion to a substrate, particularly a silicon wafer, and has such a serious problem that the resin is peeled from the substrate by a treatment at a high temperature at a high humidity after curing This problem cannot be completely solved by adding to the precursor a silane coupling agent or the like which is put on market for improving adhesion, and at present, the use thereof is severely limited.

OBJECT AND SUMMARY OF THE INVENTION

An object of this invention is to provide a positive type photosensitive resin which has a high sensitivity and can give a pattern with a high yield of residual film thickness and is excellent in adhesion to an encapsulating resin and a substrate.

Another object of this invention is to provide a semiconductor device having a high reliability in which a pattern of a polybenzoxazole resin has been formed with a high yield of residual film thickness on a semiconductor element by using the above positive type photosensitive resin excellent in adhesion to an encapsulating resin.

Other objects and advantages of this invention will become apparent from the following description.

According to this invention, there is provided a positive type photosensitive resin composition which comprises:
(A) 100 parts by weight of a polyamide represented by the general formula (1):

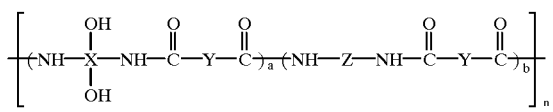

wherein X represents a tetravalent aromatic group; Y is a divalent aromatic group; Z is a group represented by the following formula:

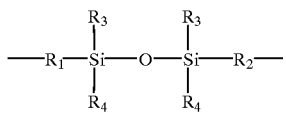

in which $R_1$ and $R_2$ represent divalent organic groups and $R_3$ and $R_4$ represent monovalent organic groups; a and b represent mole fractions; a+b=100 mole %; a=60.0 to 100.0 mole %; b=0 to 40 mole %; and n is an integer of 2 to 500,
(B) 1 to 100 parts by weight of a photosensitive diazoquinone compound, and
(C) 1 to 50 parts by weight of at least one member selected from the group consisting of phenol compounds represented by the general formulas (2) and (3):

(2)

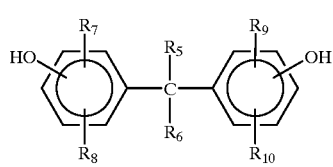

wherein $R_5$ and $R_6$ represent hydrogen atoms or alkyl groups and each of $R_7$, $R_8$, $R_9$ and $R_{10}$ represents independently a member selected from the group consisting of a hydrogen atom, a hydroxyl group and an alkyl group, (3)

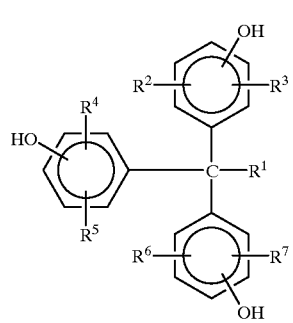

wherein $R^1$ represents a hydrogen atom or an alkyl group; and each of $R^2$, $R^3$, $R^4$, $R^5$, $R^6$ and $R^7$ represents independently a member selected from the group consisting of a hydrogen atom, a halogen atom, a hydroxyl group, an alkyl group and an alicyclic group; and/or (D) 0.1 to 20 parts by weight of at lease one member selected from the group consisting of organosilicon compounds represented by the general formulas (8), (9) and (10):

(8)

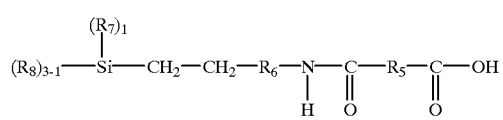

wherein $R_5$ represents a divalent organic group; $R_6$ represents a divalent organic group; $R_7$ and $R_8$ may be the same as or different from each other and each represents independently a monovalent organic group; and l represents an integer of 0, 1 or 2, (9)

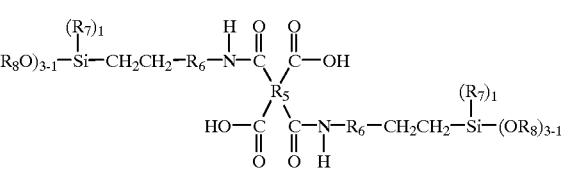

wherein $R_5$ represents a tetravalent aromatic group; $R_6$ represents a divalent aromatic group; $R_7$ and $R_8$ may be the same as or different from each other and each represents independently a monovalent organic group; and l represents an integer of 0, 1 or 2, and (10)

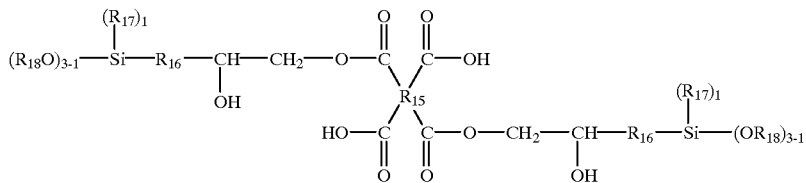

wherein $R_{15}$ represents a tetravalent aromatic group; $R_{16}$ represents a divalent organic group; $R_{17}$ and $R_{18}$ may be the same as or different from each other and each represents independently a monovalent organic group; and l represents an integer of 0, 1 or 2.

According to this invention, there is further provided a semiconductor device wherein a film of a polybenzoxazole resin represented by the general formula (15) is formed in a thickness of 0.1 to 20 μm on a semiconductor element:

(15)

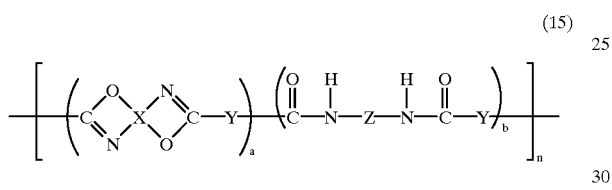

wherein X represents a tetravalent aromatic group; Y represents a divalent aromatic group; and Z represents a group represented by the following formula:

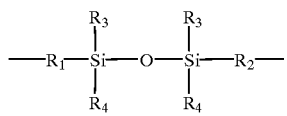

in which $R_1$ and $R_2$ represent divalent organic groups and $R_3$ and $R_4$ represent monovalent organic groups; a and b represent mole fractions; a+b=100 mole %; a is 60.0 to 100.0 mole %; b is 0 to 40.0 mole %; and n is an integer of 2 to 500.

DETAILED DESCRIPTION OF THE INVENTION

The polyamide represented by the general formula (1) consists of a bisaminophenol having the X structure, a dicarboxylic acid having the Y structure and optionally a diamine having the Z structure, and this polyamide undergoes ring-closure upon heating at about 300–400° C., to be converted into a polybenzoxazole represented by the above-mentioned general formula (15) which is a heat resistant resin.

In the polyamide represented by the general formula (1) in this invention, X includes, for example,

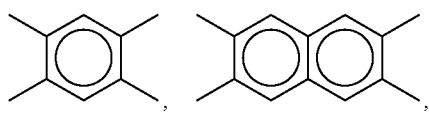

-continued

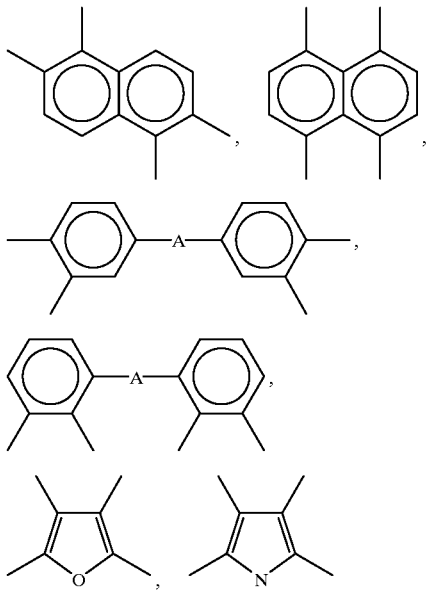

wherein A represents —$CH_2$—, —O—, —S—, —$SO_2$—, —CO—, —NHCO, —$C(CH_3)_2$— or —$C(CF_3)_2$—, and the like, but is not limited thereto.

Among them, those represented by the general formula (12) are preferable because a high sensitivity is imparted by them:

(12)

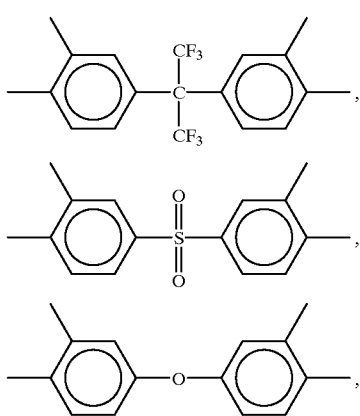

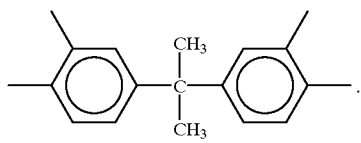

In the general formula (1), Y includes, for example, the following groups:

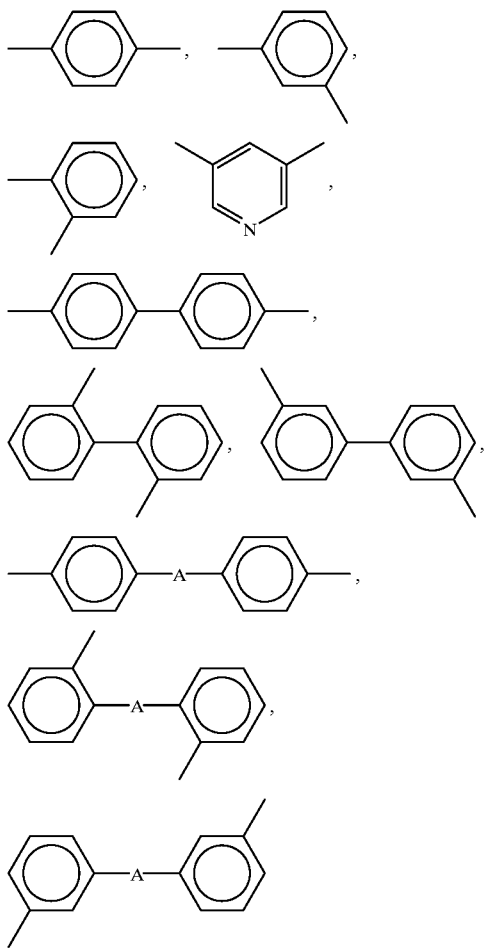

wherein A represents —CH$_2$—, —O—, —S—, —SO$_2$—, —CO—, —NHCO— or —C(CF$_3$)$_2$—, and the like, but is not limited thereto.

Among them, groups represented by the general formula (13) are preferable because a high sensitivity is imparted by them:

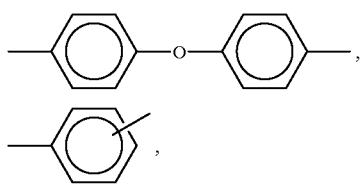

(13)

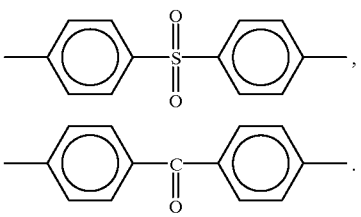

Furthermore, in the general formula (1), Z includes, for example,

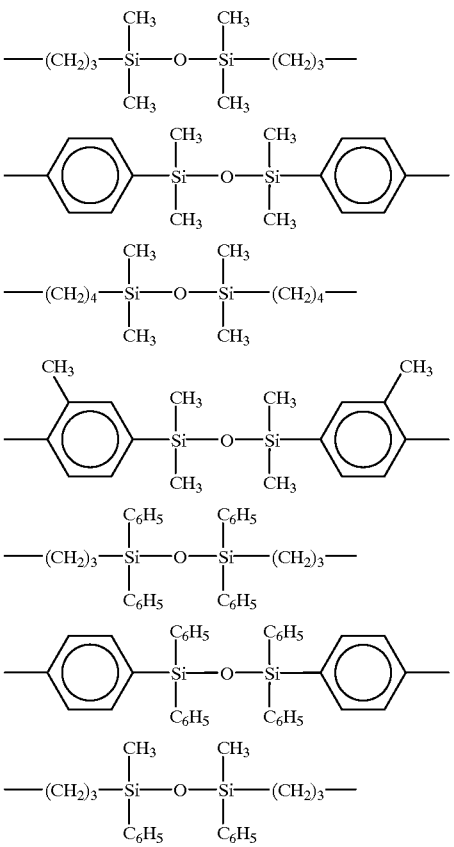

and the like, but is not limited thereto.

In the general formula (1), Z is used particularly when an adhesion to a substrate such as a silicon wafer is required, and the Z structure can be used in a proportion of at most 40.0 mole %. When the proportion exceeds 40.0 mole %, the solubility of the resin is extremely lowered, scum is produced and the pattern processing becomes impossible. Incidentally, each of X, Y and Z may be used alone or in combination of two or more.

As the polyamide, a polyamide represented by the formula (17) corresponding to the general formula (1) in which b=0 is preferably used:

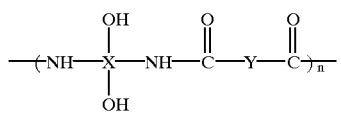

(17)

wherein X represents a tetravalent aromatic group, Y represents a divalent aromatic group and n is an integer of 2 to 500.

The photosensitive diazoquinone compound used in this invention is a compound having a 1,2-benzoquinone diazide structure or a 1,2-naphthoquinone diazide structure, and is a compound known by U.S. Pat. Nos. 2,772,972; 2,797,213 and 3,669,658. Said compound includes, for example, compounds represented by the following formulas:

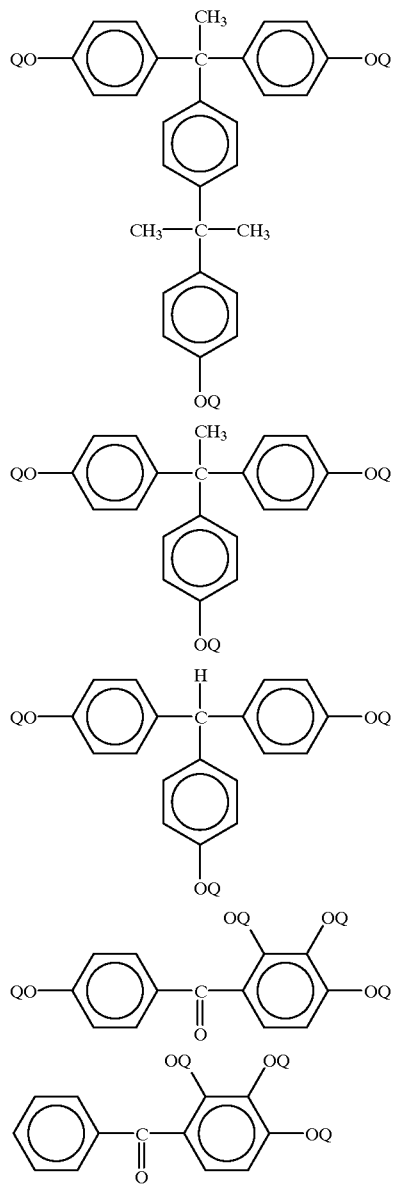

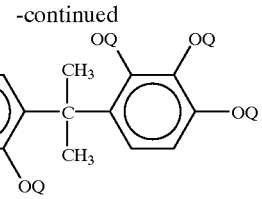

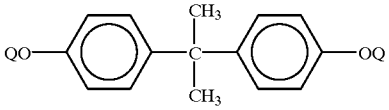

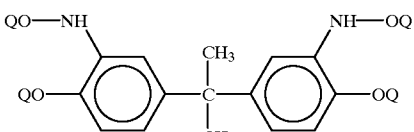

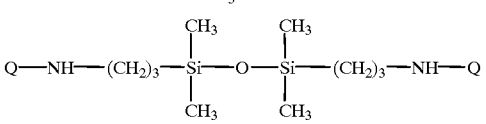

wherein Q represents a hydrogen atom,

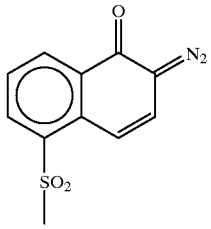

or

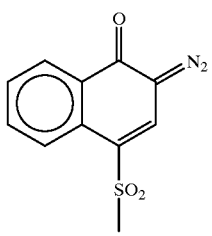

and in each of the above compounds, at least one Q group is

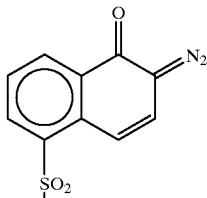

or

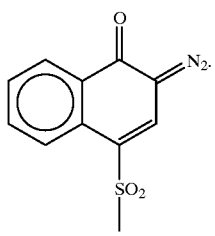

Among the above compounds, the following compounds are preferable in view of high yield of residual film thickness:

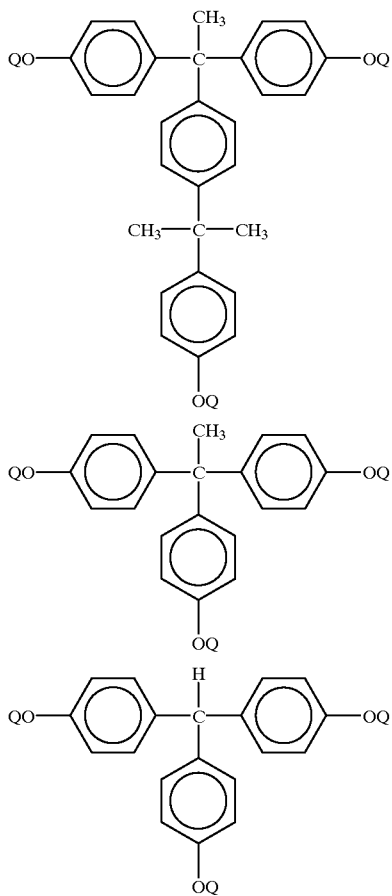

wherein Q is a hydrogen atom,

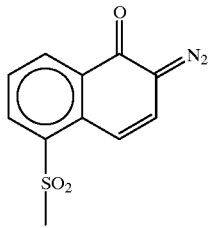

or

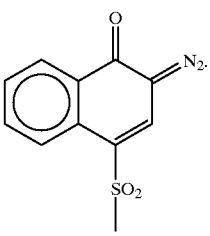

The amount of the photosensitive diazoquinone compound (B) incorporated into the polyamide (A) is 1 to 100 parts by weight per 100 parts by weight of the polyamide (A). When the amount is less than 1 part by weight, the patterning property of the resin is unsatisfactory, while when the amount exceeds 100 parts by weight, the tensile elongation of the film is remarkably lowered. A semiconductor device in which a film having a small tensile elongation is coated on the surface of a semiconductor element is not desirable because the reliability is lowered by a stress such as thermal stress or the like.

The positive type photosensitive resin composition of this invention can have, if necessary, added thereto a dihydropyridine derivative for enhancing the photosensitive characteristics. The dihydropyridine derivative includes, for example, 2,6-dimethyl-3,5-diacetyl-4-(2'-nitrophenyl)-1,4-dihydropyridine, 4-(2'-nitrophenyl)-2,6-dimethyl-3,5-dicarboethoxy-1,4-dihydropyridine, 4-(2',4'-dinitrophenyl)-2,6-dimethyl-3,5-carbomethoxy-1,4-dihydropyridine and the like.

In the positive type photosensitive resin composition of this invention, it is important that at least one member selected from the group consisting of phenol compounds represented by the general formulas (2) and (3) is contained in addition to the above components (A) and (B).

The technique of adding a phenol compound to a positive type resist composition is disclosed in, e.g., JP-A-3-200,251; JP-A-3-200,252; JP-A-3-200,253; JP-A-3-200,254; JP-A-4-1,650; JP-A-4-1,651; JP-A-4-11,260; JP-A-4-12,356; and JP-A-4-12,357. However, phenol compounds as mentioned in these publications have only a small effect of enhancing the sensitivity when they are incorporated into the positive type photosensitive resin of this invention in which the base resin is a polyamide.

However, when the phenol compound represented by the general formula (2) or (3) of this invention is used, the dissolution rate in the exposed portion is increased, and the sensitivity is enhanced. Furthermore, the film loss in the unexposed portion as seen when the sensitivity is increased by reducing the molecular weight is very small. In this invention, moreover, by adding the phenol compound represented by the general formula (2) or (3), there can be obtained a positive type photosensitive resin composition having such new characteristics that the adhesion of the composition to an encapsulating resin is enhanced, and when this composition is coated on the surface of a semiconductor element, it has been confirmed that the reliability of the semiconductor device is enhanced.

The compounds represented by the general formula (2) include the following compounds but are not limited thereto:

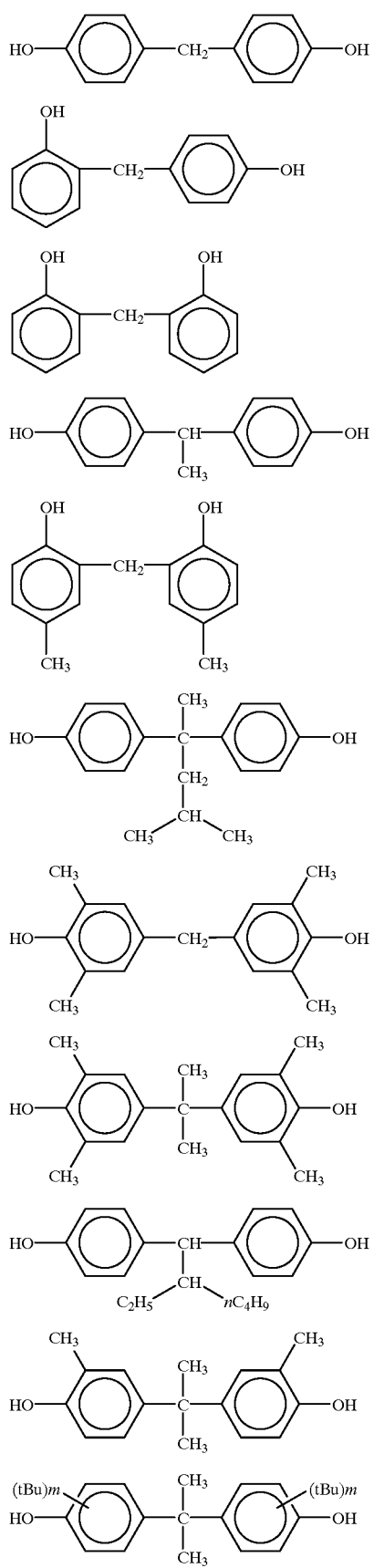
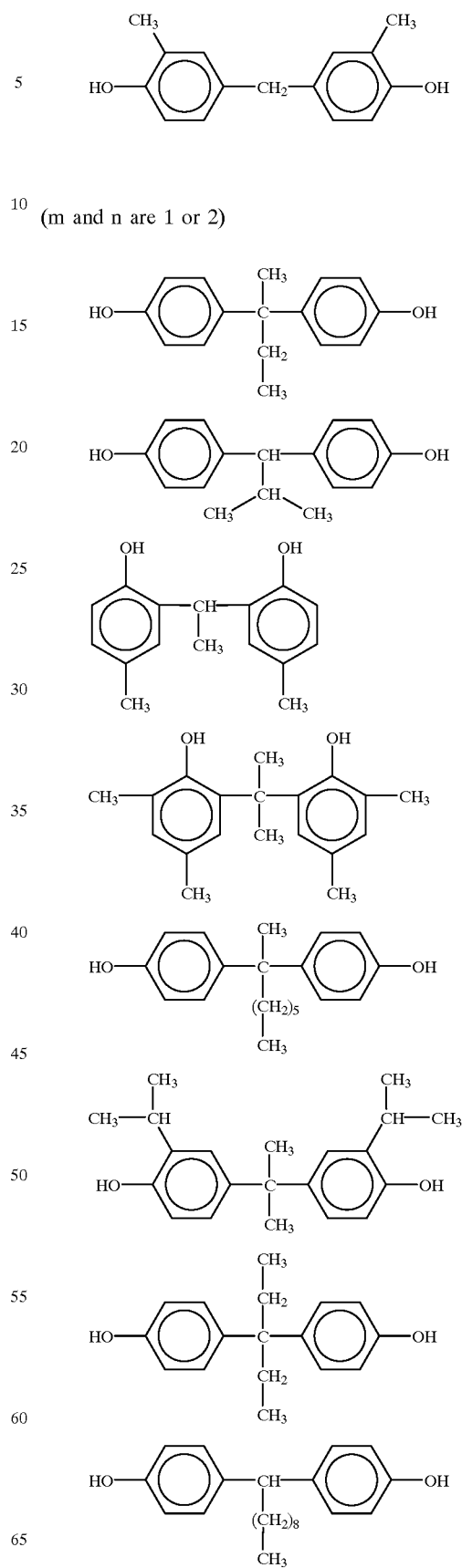
-continued
(m and n are 1 or 2)

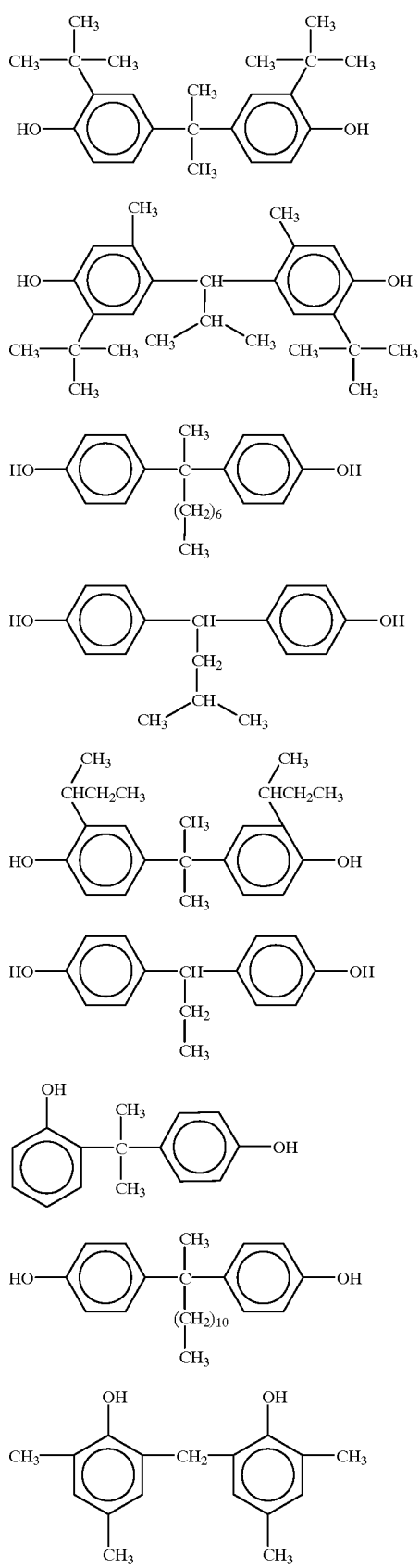
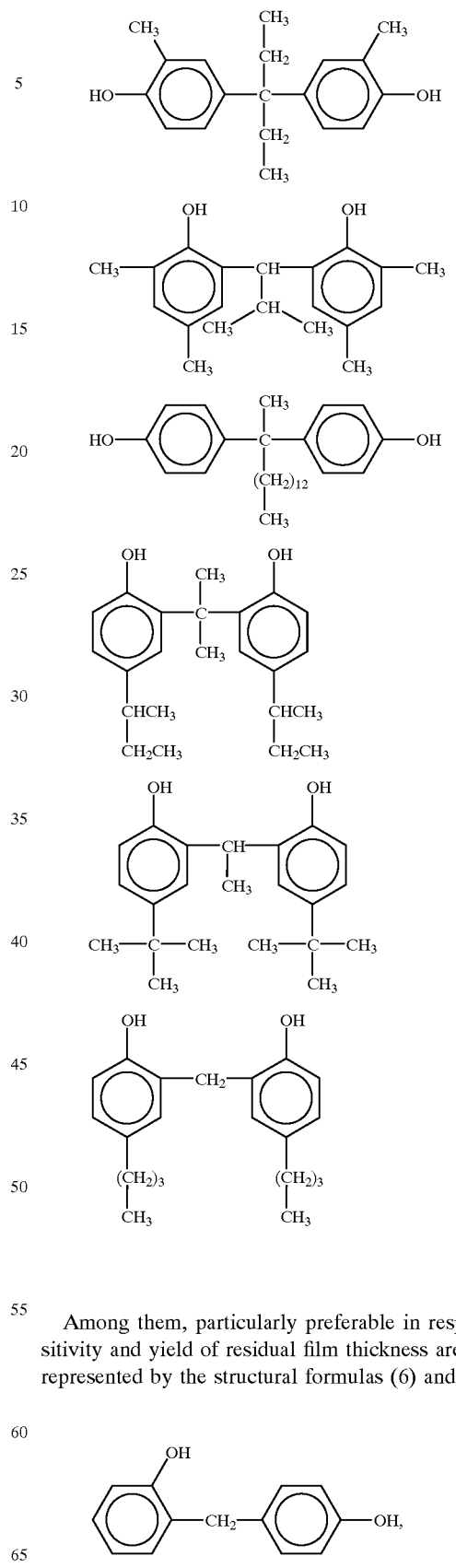
Among them, particularly preferable in respects of sensitivity and yield of residual film thickness are compounds represented by the structural formulas (6) and (7):
(6)
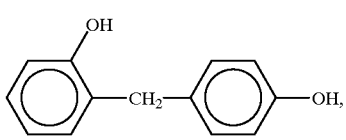

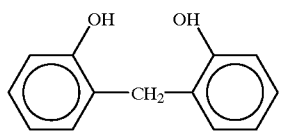

(7)

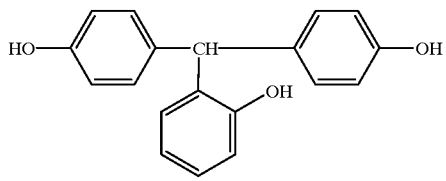

and they are preferably contained alone or in combination in the phenol compound (C) in a proportion of at least 50% by weight of the total weight of the phenol compounds.

The phenol compound represented by the general formula (2) is low in solubility at low temperatures, so that when, for example, a composition containing the phenol compound represented by the general formula (2) is stored at a very low temperature, the deposition of the phenol compound of the general formula (2) is seen in some cases. In such a case, a part of the phenol compound of the general formula (2) can be replaced by a phenol compound of the general formula (3) to enhance the storability at low temperatures.

The phenol compound represented by the general formula (3) includes the following compounds but is not limited thereto:

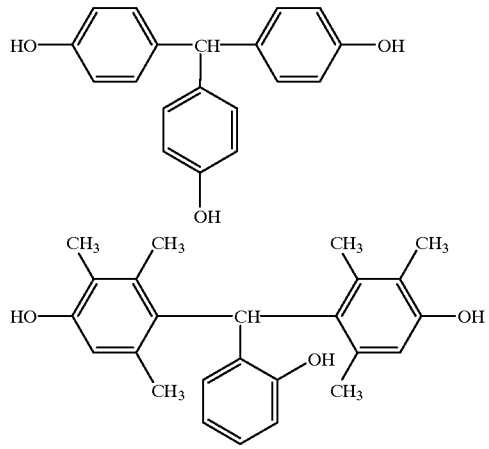

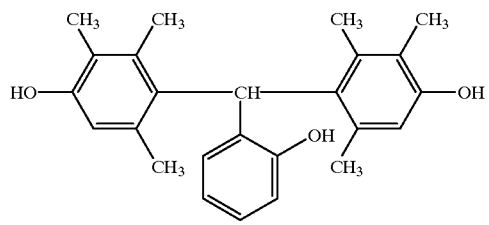

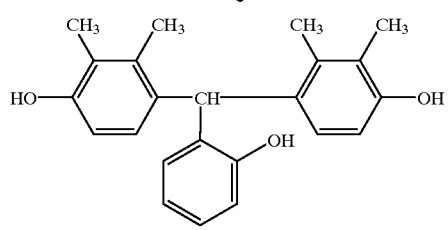

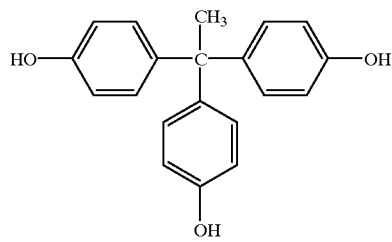

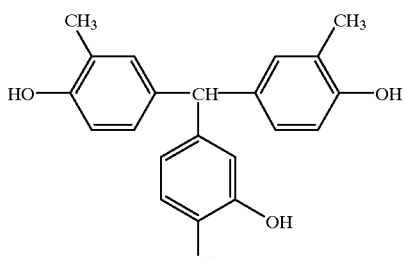

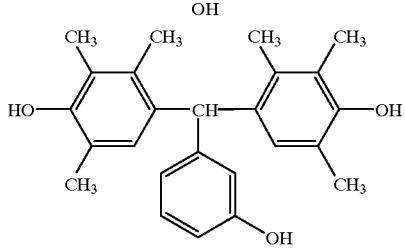

-continued
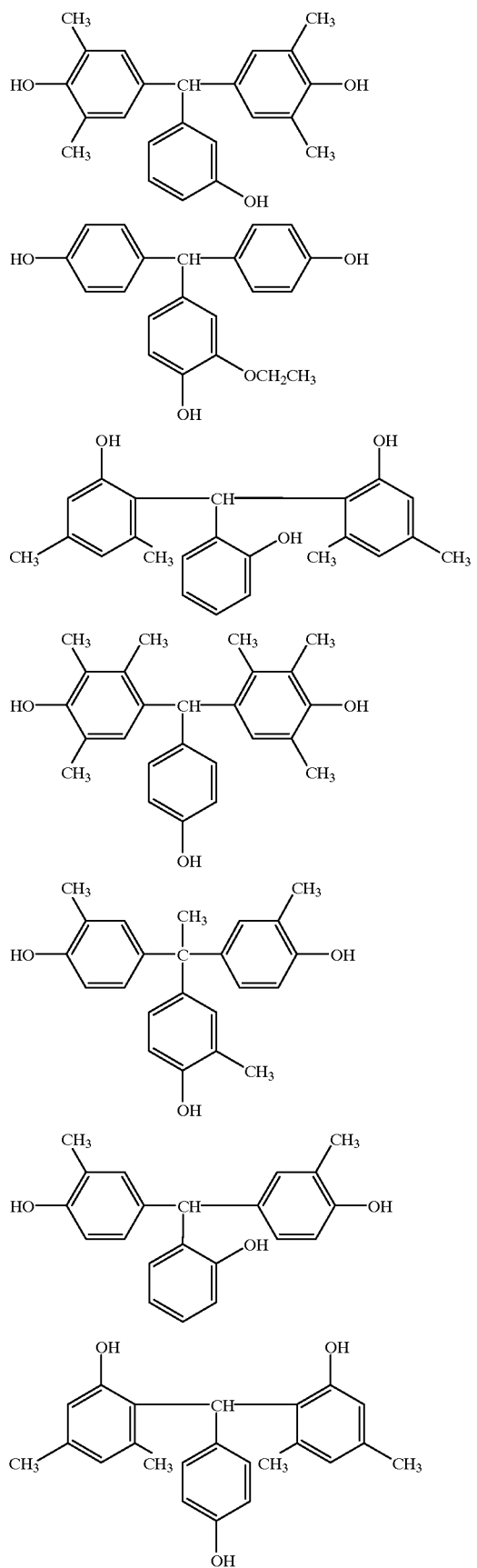
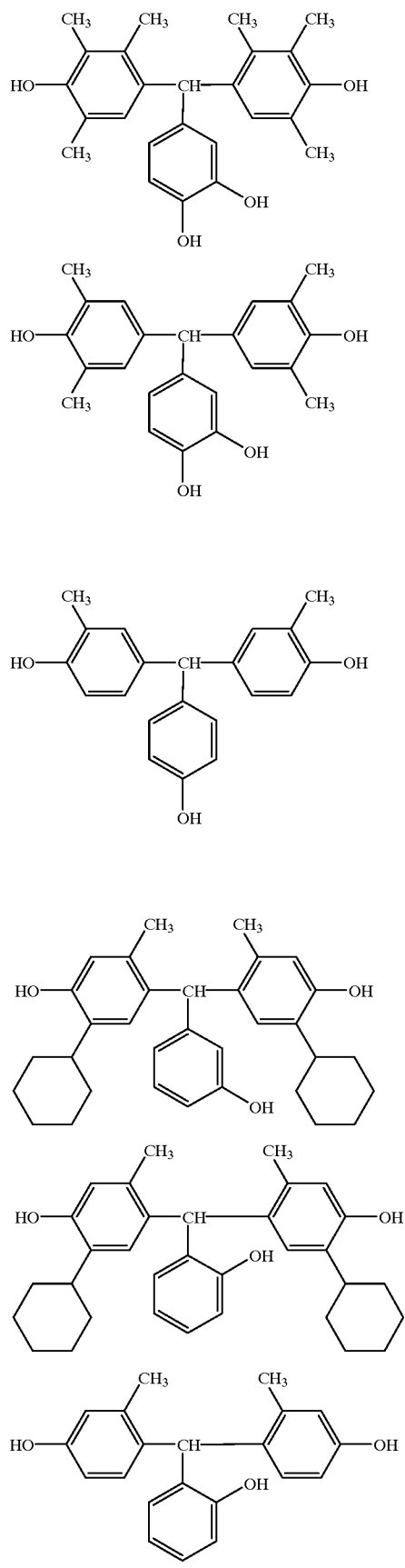

-continued

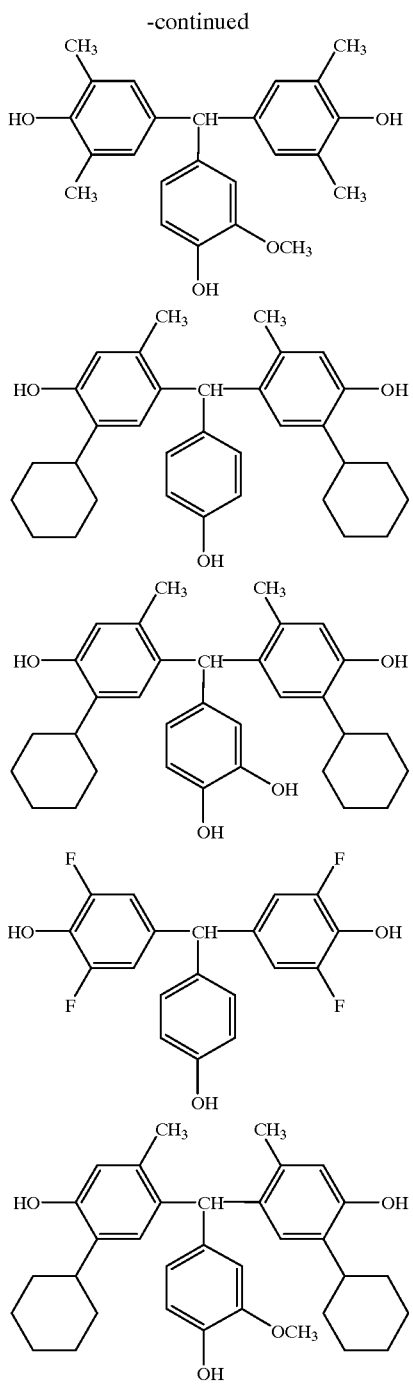

The amount of the phenol compound (C) added is 1 to 50 parts by weight per 100 parts by weight of the polyamide (A). When the amount is less than 1 part by weight, no effect of increasing the sensitivity is obtained, and when the amount exceeds 50 parts by weight, the reduction of the yield of residual film thickness becomes large or deposition is caused during the storage under refrigeration and hence said amount is poor in practicality.

The organosilicon compounds (D) represented by the general formulas (8), (9) and (10) in this invention are used for increasing the adhesion between the photosensitive resin and an encapsulating resin. These compounds may be used alone or in admixture of two or more kinds, and the amount of the compound (D) added is 0.1 to 20 parts by weight per 100 parts by weight of the polyamide (A). When the amount is less than 0.1 part by weight, no effect of enhancing the adhesion is obtained, and when the amount exceeds 20 parts by weight, the mechanical strength of the film of polybenzoxazole formed on a semiconductor element is lowered and the stress-relaxing effect becomes small, so that the above amounts are not desirable.

The organosilicon compound represented by the general formula (8) is disclosed in U.S. Pat. Nos. 3,755,354 and 4,460,739 and hence is a known compound. The present inventors have found that when this organosilicon compound is added to such a photosensitive polybenzoxazole precursor as shown in JP-B-1-46,862, there can be obtained such a high adhesion to a silicon wafer as not obtained with the conventional silane coupling agent or the like.

The organosilicon compound represented by the general formula (9) is described in JP-A-1-215,869 and is a known material used as one of the starting materials for a curable composition for forming a protective film for a transparent plate, a color filter or the like. The present inventors have found that when this organosilicon compound is added to such a photosensitive polybenzoxazole precursor as shown in JP-B-1-46,862, there can be obtained such a high adhesion to a silicon wafer as not obtained with the conventional silane coupling agent or the like.

The organosilicon compounds represented by the general formulas (8) and (9) can be easily obtained by subjecting an acid anhydride or dianhydride and a silane coupling agent having an amino group to reaction at 20–100° C. for 30 minutes to 10 hours in an organic solvent. The acid anhydride used includes, for example, maleic anhydride, succinic anhydride, methyltetrahydrophthalic anhydride, methylhexahydrophthalic anhydride, methylhimic anhydride, hexahydrophthalic anhydride, tetrahydrophthalic anhydride, phthalic anhydride and the like, but is not particularly limited thereto.

Examples of the acid dianhydride include, for example, pyromellitic dianhydride, benzene-1,2,3,4-tetracarboxylic dianhydride, 3,3',4,4'-benzophenonetetracarboxylic dianhydride, 2,2',3,3'-benzophenonetetracarboxylic dianhydride, 2,2,3',4'-benzophenonetetracarboxylic dianhydride, naphthalene-2,3,6,7-tetracarboxylic dianhydride, naphthalene-1,2,5,6-tetracarboxylic dianhydride, naphthalene-1,2,4,5-tetracarboxylic dianhydride, naphthalene-1,4,5,8-tetracarboxylic dianhydride, naphthalene-1,2,6,7-tetracarboxylic dianhydride, 4,8-dimethyl-1,2,3,5,6,7-hexahydronaphthalene-1,2,5,6-tetracarboxylic dianhydride, 4,8-dimethyl-1,2,3,5,6,7-hexahydronaphthalene-2,3,6,7-tetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, 1,4,5,8-tetrachloronaphthalene-2,3,6,7-tetracarboxylic dianhydride, 3,3'4,4'-diphenyltetracarboxylic dianhydride, 2,2'3,3'-diphenyltetracarboxylic dianhydride, 2,3,3',4'-diphenyltetracarboxylic dianhydride, 3,3",4,4"-p-terphenyltetracarboxylic dianhydride, 2,2",3,3"-p-terphenyltetracarboxylic dianhydride, 2,3,3",4"-p-terphenyltetracarboxylic dianhydride, 2,2-bis(2,3-dicarboxyphenyl )propane dianhydride, 2,2-bis(3,4-dicarboxyphenyl)propane dianhydride, bis(2,3-dicarboxyphenyl)ether dianhydride, bis(3,4-dicarboxyphenyl)ether dianhydride, bis(2,3-dicarboxyphenyl)-methane dianhydride, bis(3,4-dicarboxyphenyl)methane dianhydride, bis(2,3-dicarboxyphenyl)sulfone dianhydride, bis(3,4- dicarboxyphenyl)sulfone dianhydride, 1,1-bis(2,3-dicarboxyphenyl)ethane dianhydride, 1,1-bis(3,4-dicarboxyphenyl)ethane dianhydride, perylene-2,3,8,9-tetracarboxylic dianhydride, perylene-3,4,9,10-tetracarboxylic dianhydride, perylene-4,5,10,11-tetracarboxylic dianhydride, perylene-5,6,11,12-tetracarboxylic dianhydride, phenanthrene-1,2,7,8-tetracarboxylic dianhydride, phenanthrene-1,2,6,7-tetracarboxylic dianhydride, phenanthrene-1,2,9,10-tetracarboxylic dianhydride, pyrazine-2,3,5,6-tetracarboxylic dianhydride, pyrrolidine-2,3,4,5-tetracarboxylic dianhydride, thiophene-2,3,4,5-tetracarboxylic dianhydride, 4,4'-hexafluoroisopropylidenediphthalic dianhydride and the like, but is not limited thereto.

Examples of the silane coupling agent having an amino group includes γ-aminopropyltrimethoxysilane, γ-aminopropyltriethoxysilane, γ-aminopropylmethyldiethoxysilane, γ-aminopropylmethyldimethoxysilane, γ-aminopropylethyldimethoxysilane, γ-aminopropylethyldiethoxysilane, γ-aminopropyldimethylmethoxysilane, γ-aminopropyldimethylethoxysilane, γ-aminopropyldiethylmethoxysilane, γ-aminopropyldiethylethoxysilane, N-(β-aminoethyl)-γ-aminopropyltrimethoxysilane, N-(β-aminoethyl)-γ-aminopropyltriethoxysilane, N-(β-aminoeth-yl)-γ-aminopropylmethyldimethoxysilane, 4-aminobutyldimethylmethoxysilane and the like.

The organosilicon compound represented by the general formula (10) is easily obtained by subjecting a silane-coupling agent having an epoxy group and a tetracarboxylic dianhydride to reaction at a temperature of 20 to 100° C. for a period of 30 minutes to 10 hours. Examples of the acid dianhydride are the same as mentioned for the organosilicon compound represented by the general formula (9). Examples of the silane-coupling agent include γ-glycidoxypropyltrimethoxysilane, γ-glycidoxypropyltriethoxysilane, γ-glycidoxypropylmethyldimethoxysilane, γ-glycidoxypropylmethyldiethoxysilane, γ-glycidoxypropylethyldimethoxysilane, γ-glycidoxypropylethyldiethoxysilane, γ-glycidoxypropyldimethylmethoxysilane, γ-glycidoxypropyldimethylethoxysilane, γ-glycidoxypropyldiethylmethoxysilane, γ-glycidoxypropyldiethylethoxysilane and the like.

To the positive type photosensitive resin composition of this invention can be added, if necessary, an additive such as a leveling agent, a silane-coupling agent or the like.

In this invention, the above-mentioned components are dissolved in a solvent to form a varnish and this varnish is used. As the solvent, there may be used alone or in admixture N-methyl-2-pyrrolidone, γ-butyrolactone, N,N-dimethylacetamide, dimethylsulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol 3-monomethyl ether, methyl pyruvate, ethyl pyruvate, methyl 3-methoxypropionate and the like.

In the method of using the positive type photosensitive resin composition of this invention, first of all, the composition is coated on a suitable support, for example, a silicon wafer, a ceramic plate, an aluminum plate or the like. The coating method includes a spin coating using a spinner, a spray coating using a spray coater, an immersion, a printing, a roll coating and the like. Subsequently, the resulting support is prebaked at a temperature of 60 to 120° C. to dry the coating film and thereafter irradiated with an actinic radiation in the form of the desired pattern. As the actinic radiation, there can be used X ray, electron beam, ultraviolet ray, visible ray and the like; and, it is preferable to use an actinic radiation having a wavelength of 200 to 500 nm. Subsequently, the irradiated portion is dissolved and removed using a developer to obtain a relief pattern. As the developer, there can suitably used an aqueous solution of an alkali, for example, an inorganic alkali such as sodium hydroxide, potassium hydroxide, sodium carbonate, sodium silicate, sodium metasilicate, ammonia water or the like; a primary amine such as ethylamine, n-propylamine or the like; a secondary amine such as diethylamine, di-n-propylamine or the like; a tertiary amine such as triethylamine, methyldiethylamine or the like; an alcoholamine such as dimethylethanolamine, triethanolamine or the like; a quaternary ammonium salt such as tetramethylammonium hydroxide, tetraethylammonium hydroxide or the like, or there can also be used an aqueous solution formed by adding to the above alkali solution suitable amounts of a water-soluble organic solvent, for example, an alcohol such as methanol, ethanol or the like and a surfactant. As the development method, there can be used spray, paddle, immersion, ultrasonic wave or the like. Subsequently, the relief pattern formed by the development is rinsed. As the rinse, distilled water is used. Subsequently, the rinsed pattern is heat-treated to form an oxazole ring, thereby obtaining the final pattern rich in heat resistance.

The positive type photosensitive resin composition of this invention is useful for not only semiconductor applications but also interlaminar insulation of a multilayer circuit and also useful as a cover coat of a flexible copper-clad laminate, a solder resist film, a liquid crystal alignment layer or the like.

DESCRIPTION OF THE PREFERRED EMBODIMENTS

Examples are shown below to explain this invention more specifically.

EXAMPLE 1

Synthesis of Polyamide

In 150 parts by weight of N,N-dimethylacetamide and 33.2 parts by weight (0.420 mole) of pyridine was dissolved 36.6 parts by weight (0.100 mole) of 2,2-bis(3-amino-4-hydroxyphenyl)hexafluoropropane.

Subsequently, 4.3 parts by weight (0.021 mole) of isophthalic acid chloride and 17.0 parts by weight (0.084 mole) of terephthalic acid chloride dissolved in 100 parts by weight of cyclohexanone were dropped thereinto at a temperature of −10 to −15° C. over 30 minutes, and thereafter, the resulting mixture was stirred at room temperature for 4 hours to complete the reaction. The reaction mixture was filtered and then the resulting solution was introduced into water to precipitate an objective polyamide (A1) represented by the general formula (1) in which X is a tetravalent group represented by the formula (X-1):

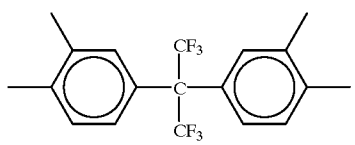
(X-1)

Y is a mixture of divalent groups represented by the formulas (Y-1) and (Y-2):

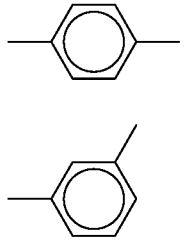
(Y-1)

(Y-2)

a=100 and b=0. The precipitates were collected by filtration, sufficiently washed with water and thereafter dried at 80° C. under vacuum for 24 hours.

Preparation of Positive Type Photosensitive Resin Composition

In 200 parts by weight of N-methyl-2-pyrrolidone were dissolved 100 parts by weight of the polyamide (A1) obtained above, 25 parts by weight of a diazoquinone represented by the general formula (Q1):

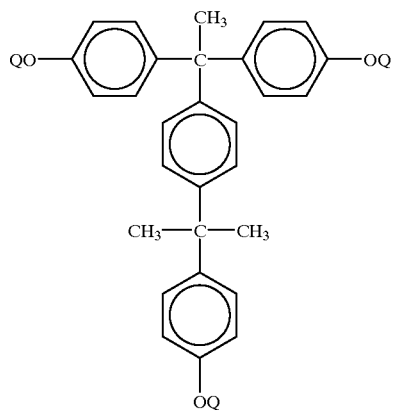
(Q1)

wherein Q represents a hydrogen atom or

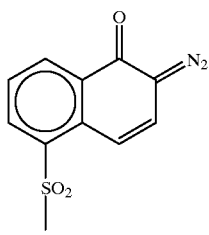

and and 70% of a total of the Q groups is

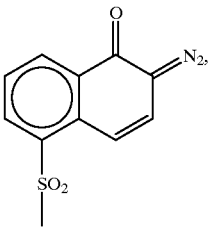

and 15 parts by weight of a phenol compound represented by the structural formula (P-1):

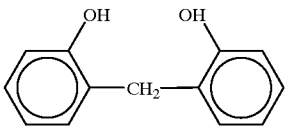
(P-1)

and thereafter, filtered through a 0.2-$\mu$m Teflon filter to obtain a photosensitive resin composition.

Evaluation of Characteristics

This positive type photosensitive resin composition was coated on a silicon wafer by use of a spin coater and thereafter dried at 70° C. for one hour in an oven to obtain a coating film having a thickness of about 3 $\mu$m. This coating film was exposed to light through a reticle by a g-line stepper exposing machine NSR-1505G3A (a trade name of NIKON CORP.) while changing the exposing portion of the coating film and increasing the exposure dose from 50 mJ/cm$^2$ to 540 mJ/cm$^2$ at a rate of 10 mJ/cm$^2$.

Subsequently, the exposed coating film was immersed in a 0.79% aqueous solution of tetramethylammonium hydroxide for 30 seconds to dissolve and remove the exposed portion and then rinsed with pure water for 30 seconds. As a result, it-was confirmed that a pattern was formed in the portion irradiated at an exposure dose of 200 mJ/cm$^2$ or more (namely, the sensitivity was 200 mJ/cm$^2$). The yield of residual film thickness at this time [(film thickness after development/film thickness before development)×100] was 91.3% which was a very high value.

Moreover, separately, the same positive type photosensitive resin composition was similarly coated on a silicon wafer, prebaked and thereafter heated in an oven at 150° C. for 30 minutes, at 250° C. for 30 minutes and at 350° C. for 30 minutes in this order to cure the resin.

Furthermore, on the cured film, a semiconductor-encapsulating epoxy resin composition (EME-6300H, a trade name of Sumitomo Bakelite Co., Ltd.) was molded in a size of 2×2×2 mm (width×length×height). Using a tensilometer, the encapsulating epoxy resin composition molded on the cured film of a polybenzoxazole resin was peeled away to measure the shear strength. The result thereof was 3.2 kg/mm$^2$.

EXAMPLE 2

The same procedure as in Example 1 was repeated, except that the phenol compound (P-1) was replaced by a phenol compound represented by the structural formula (P-2):

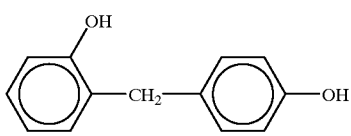
(P-2)

to obtain the results shown in Table 1.

EXAMPLE 3

The same procedure as in Example 1 was repeated, except that the phenol compound (P-1) was replaced by a mixture of phenol compounds represented by the structural formulas (P-3):

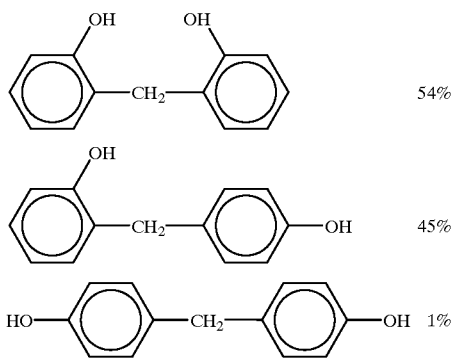
(P-3)

to obtain the results shown in Table 1.

EXAMPLE 4

The same procedure as in Example 1 was repeated, except that the amount of the phenol compound (P-1) added was changed to 5 parts by weight, to obtain the results shown in Table 1.

EXAMPLE 5

The same procedure as in Example 1 was repeated, except that in the synthesis of a polyamide, diphenyl ether-4,4'-dicarboxylic acid chloride was substituted for the terephthalic acid chloride and. isophthalic acid chloride to prepare a polyamide (A2) represented by the general formula (1) wherein X is a tetravalent group represented by the above-mentioned formula (X-1), Y is a divalent group represented by the formula (Y-3):

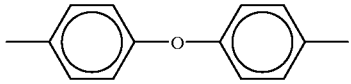
(Y-3)

a=100 and b=0 to obtain the results shown in Table 1.

EXAMPLE 6

The same procedure as in Example 1 was repeated, except that in the synthesis of a polyamide, diphenyl ether-4,4'-dicarboxylic acid chloride was substituted for the terephthalic acid chloride and isophthalic acid chloride and 3,3'-diamino-4,4'-dihydroxydiphenylsulfone was substituted for the 2,2-bis(3-amino-4-hydroxyphenyl)hexafluoropropane to prepare a polyamide (A3) represented by the general formula (1) wherein X is a tetravalent group represented by the formula (X-2):

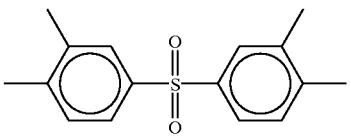
(X-2)

Y is a divalent group represented by the above-mentioned formula (Y-3), a=100 and b=0, to obtain the results shown in Table 1.

EXAMPLE 7

The same procedure as in Example 1 was repeated, except that in the synthesis of a polyamide, diphenyl ether-4,4'-dicarboxylic acid chloride was substituted for the terephthalic acid chloride and isophthalic acid chloride and 3,3'-diamino-4,4'-dihydroxydiphenyl ether was substituted for the 2,2-bis(3-amino-4-hydroxyphenyl)hexafluoropropane to prepare a polyamide (A4) represented by the general formula (1) wherein X is a tetravalent group represented by the formula (X-3):

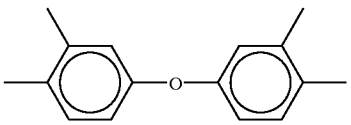
(X-3)

Y is a divalent group represented by the above-mentioned formula (Y-3), a=100 and b=0, and that the diazoquinone (Q1) was replaced by a diazoquinone represented by the general formula (Q2):

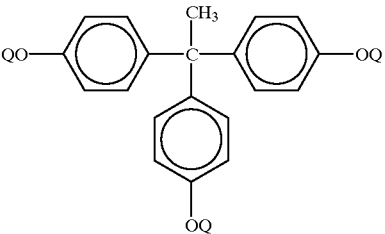
(Q2)

wherein Q represents a hydrogen atom or and 70% of a total of the Q groups is

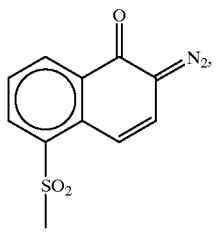

to obtain the results shown in Table 1.

EXAMPLE 8

The same procedure as in Example 1 was repeated, except that in the synthesis of a polyamide, the amount of the 2,2-bis(3-amino-4-hydroxyphenyl)hexafluoropropane was reduced to 34.8 parts by weight (0.095 mole) and instead thereof 1.24 parts by weight (0.005 mole) of 1,3-bis(3-aminopropyl)-1,1,3,3-tetramethyldisiloxane was added, to synthesize a polyamide (A5) represented by the general formula (1) wherein X is a tetravalent group represented by the above-mentioned formula (X-1), Y is a mixture of divalent groups represented by the above-mentioned formulas (Y-1) and (Y-2), Z is a divalent group represented by the formula (Z-1):

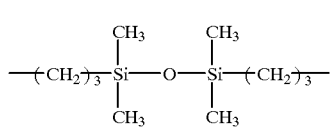

a=95 and b=5, to obtain the results shown in Table 1.

Comparative Example 1

The same procedure as in Example 1 was repeated, except that the phenol compound was not added, to obtain the results shown in Table 1.

Comparative Example 2

The same procedure as in Example 5 was repeated, except that the phenol compound was not added, to obtain the results shown in Table 1.

Comparative Example 3

The same procedure as in Example 6 was repeated, except that the phenol compound was not added, to obtain the results shown in Table 1.

Comparative Example 4

The same procedure as in Example 1 was repeated, except that the amount of the phenol compound added was decreased to 0.5 part by weight, to obtain the results shown in Table 1.

Comparative Example 5

The same procedure as in Example 1 was repeated, except that the amount of the phenol compound added was increased to 60 parts by weight, to obtain the results shown in Table 1.

Comparative Example 6

The same procedure as in Example 1 was repeated, except that the phenol compound was replaced by a phenol compound represented by the structural formula (P-4):

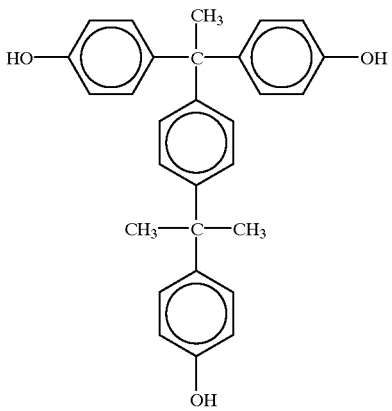

to obtain the results shown in Table 1.

Comparative Example 7

The same procedure as in Example 1 was repeated, except that the phenol compound was replaced by a phenol compound represented by the structural formula (P-5):

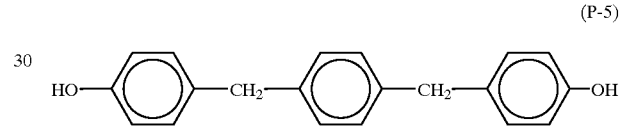

to obtain the results shown in Table 1.

Comparative Example 8

The same procedure as in Example 1 was repeated, except that the phenol compound was replaced by a phenol compound represented by the structural formula (P-6):

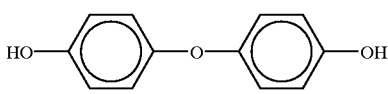

to obtain the results shown in Table 1.

The results of Examples 1–8 and Comparative Examples 1–8 are summarized in the following Table 1.

TABLE 1

|  |  | Sensitivity (mJ/cm$^2$) | Yield of residual film thickness (%) | Shear strength (kg/mm$^2$) |
|---|---|---|---|---|
| Example | 1 | 200 | 91.3 | 3.2 |
|  | 2 | 160 | 86.5 | 3.2 |
|  | 3 | 170 | 90.7 | 3.3 |
|  | 4 | 280 | 92.0 | 2.9 |
|  | 5 | 240 | 94.2 | 3.5 |
|  | 6 | 270 | 97.9 | 3.6 |
|  | 7 | 180 | 86.0 | 3.1 |
|  | 8 | 250 | 94.3 | 3.2 |
| Comparative | 1 | 300 | 91.6 | 2.4 |
|  | 2 | 370 | 90.9 | 2.6 |

TABLE 1-continued

|  |  | Sensitivity (mJ/cm$^2$) | Yield of residual film thickness (%) | Shear strength (kg/mm$^2$) |
|---|---|---|---|---|
| Example | 3 | 390 | 94.6 | 2.7 |
|  | 4 | 290 | 91.4 | 2.5 |
|  | 5 | 150 | 60.6 | 1.9 |
|  | 6 | 320 | 92.5 | 3.0 |
|  | 7 | 390 | 97.8 | 2.9 |
|  | 8 | 200 | 70.7 | 3.0 |

EXAMPLE 9

Preparation of Positive Type Photosensitive Resin Composition

In 200 parts by weight of N-methyl-2-pyrrolidone were dissolved 100 parts by weight of the polyimide (A1) synthesized in Example 1, 25 parts by weight of a diazoquinone represented by the above-mentioned structural formula (Q1) and 5 parts by weight of an organosilicon compound represented by the structural formula (S-1):

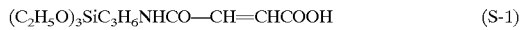

(S-1)

and the solution was filtered through a 0.2-μm Teflon filter to prepare a photosensitive resin composition.

Evaluation of Characteristics

This photosensitive resin composition in the form of a varnish was coated on a silicon wafer using a spin coater, and thereafter, dried at 70° C. for one hour in an oven to obtain a coating film having a thickness of about 6 μm. This coating film was irradiated with an ultraviolet ray from a high pressure mercury vapor lamp through a mask manufactured by TOPPAN PRINTING CO., LTD. (test chart No. 1, on which line and space of 50–0.88 μm in width were drawn), then immersed in a 0.79% aqueous solution of tetramethylammonium hydroxide for 60 seconds to dissolve and remove the exposed portion and there-after washed with pure water for 30 seconds (rinse) to remove the developer. As a result, it was confirmed that an image corresponding to the removing pattern of 5 μm in width was formed on the silicon wafer. The film thickness after the development at this time was 5.1 μm and the yield of residual film thickness [(film thickness after development/film thickness before development)×100] was 85.0%.

Moreover, separately, the same photosensitive resin composition varnish was coated on a silicon wafer in the same manner, prebaked and then heated in an oven at 150° C. for 30 minutes, at 250° C. for 30 minutes and at 350° C. for 30 minutes in this order to cure the resin. The coating film obtained was cross-cut in 1-mm width to form 100 squares, and a Cellophane tape was applied to the coating film and then peeled off in order to remove the coating film squares from the silicon wafer. The number of the coating film squares removed (referred to hereinafter as the number of peeled squares after curing) was 0, from which it was confirmed that also the adhesion of the cured film to the wafer was excellent.

Furthermore, the silicon wafer was subjected to pressure cooker treatment (PCT) at 125° C. at 2.3 atm for 100 hours and thereafter, a Cellophane tape was applied thereto and peeled off in the same manner as above to evaluate the adhesion. The number of the coating film squares removed (referred to hereinafter as the number of peeled squares after high temperature-high humidity treatment) was 0, from which it was confirmed that the adhesion after high temperature-high humidity treatment was excellent.

EXAMPLE 10

The same procedure as in Example 9 was repeated, except that the organosilicon compound was replaced by a compound represented by the structural formula (S-2):

(S-2)

to obtain the results shown in Table 2.

EXAMPLE 11

The same procedure as in Example 9 was repeated, except that the organosilicon compound was replaced by a compound represented by the structural formula (S-3):

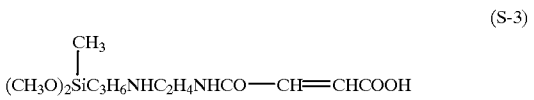

(S-3)

to obtain the results shown in Table 2.

EXAMPLE 12

The same procedure as in Example 9 was repeated, except that the amount of the organosilicon compound (S-1) added was changed to 1 part by weight, to obtain the results shown in Table 2.

EXAMPLE 13

The same procedure as in Example 9 was repeated, except that the polyamide was replaced by the polyamide (A2) synthesized in Example 5, to obtain the results shown in Table 2.

EXAMPLE 14

The same procedure as in Example 9 was repeated, except that the polyamide was replaced by the polyamide (A3) synthesized in Example 6, to obtain the results shown in Table 2.

EXAMPLE 15

The same procedure as in Example 9 was repeated, except that the polyamide was replaced by the polyamide (A4) synthesized in Example 7 and the diazoquinone was replaced by a diazoquinone represented by the above-mentioned general formula (Q2), to obtain the results shown in Table 2.

EXAMPLE 16

The same procedure as in Example 9 was repeated, except that the polyamide was replaced by the polyamide (A5) synthesized in Example 8, to obtain the results shown in Table 2.

Comparative Example 9

The same procedure as in Example 9 was repeated, except that the organosilicon compound was not added, to obtain the results shown in Table 2.

Comparative Example 10

The same procedure as in Example 13 was repeated, except that the organosilicon compound was not added, to obtain the results shown in Table 2.

Comparative Example 11

The same procedure as in Example 14 was repeated, except that the organosilicon compound was not added, to obtain the results shown in Table 2.

Comparative Example 12

The same procedure as in Example 9 was repeated, except that the amount of the organosilicon compound added was reduced to 0.05 part by weight, to obtain the results shown in Table 2.

Comparative Example 13

The same procedure as in Example 9 was repeated, except that the amount of the organosilicon compound added was increased to 50 parts by weight, to obtain the results shown in Table 2.

Comparative Example 14

The same procedure as in Example 9 was repeated, except that the organosilicon compound was replaced by an organosilicon compound represented by the structural formula (S-4):

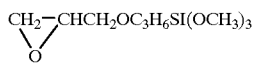
(S-4)

to obtain the results shown in Table 2.

Comparative Example 15

The same procedure as in Example 9 was repeated, except that the organosilicon compound was replaced by an organosilicon compound represented by the structural formula (S-5):

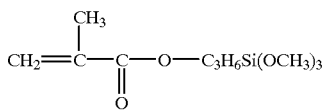
(S-5)

to obtain the results shown in Table 2.

Comparative Example 16

The same procedure as in Example 9 was repeated, except that the organosilicon compound was replaced by an organosilicon compound represented by the structural formula (S-6):

(S-6)

to obtain the results shown in Table 2.

The results of Examples 9–16 and Comparative Examples 9–16 are summarized in the following Table 2.

TABLE 2

| | Resolution (μm) | Yield of residual film thickness (%) | Adhesion (No. of peeled squares) | |
|---|---|---|---|---|
| | | | After curing | After high temp.-high humidity treatment |
| Example | | | | |
| 9 | 5 | 85.0 | 0 | 0 |
| 10 | 6 | 86.7 | 0 | 0 |
| 11 | 6 | 84.0 | 0 | 0 |
| 12 | 5 | 87.3 | 0 | 0 |
| 13 | 8 | 93.9 | 0 | 0 |
| 14 | 8 | 88.7 | 0 | 0 |
| 15 | 6 | 91.0 | 0 | 0 |
| 16 | 8 | 89.5 | 0 | 0 |
| Comparative Example | | | | |
| 9 | 5 | 88.0 | 100 | 100 |
| 10 | 6 | 89.4 | 100 | 100 |
| 11 | 6 | 90.0 | 100 | 100 |
| 12 | 6 | 88.2 | 45 | 100 |
| 13 | 20 | 32.1 | 0 | 0 |
| 14 | 15 | 96.0 | 2 | 100 |
| 15 | 6 | 87.3 | 100 | 100 |
| 16 | Since varnish was discolored, evaluation was impossible. | | | |

EXAMPLE 17

Preparation of Positive Type Photosensitive Resin Composition

In 200 parts by weight of N-methyl-2-pyrrolidone were dissolved 100 parts by weight of the polyamide (A1) synthesized in Example 1, 25 parts by weight of a diazoquinone represented by the above-mentioned structural formula (Q1) and 6 parts by weight of an organosilicon compound represented by the structural formula (S-7):

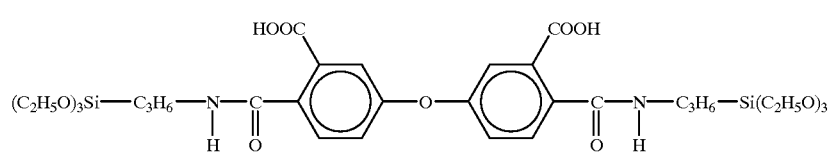
(S-7)

and then filtered through a 0.2-μm Teflon filter to obtain a photosensitive resin composition.

Evaluation of Characteristics

This photosensitive resin composition in the form of a varnish was coated on a silicon wafer using a spin coater, and thereafter, dried at 70° C. for one hour in an oven to obtain a coating film having a thickness of about 6 μm. This coating film was irradiated with an ultraviolet ray from a high pressure mercury vapor lamp through a mask manufactured by TOPPAN PRINTING CO., LTD. (test chart No. 1, on which line and space of 50–0.88 μm in width were drawn), then immersed in a 0.79% aqueous solution of tetramethylammonium hydroxide for 60 seconds to dissolve and remove the exposed portion and thereafter washed with pure water for 30 seconds (rinse) to remove the developer. As a result, it was confirmed that an image corresponding to the 5-μm removing pattern was formed on the silicon wafer. The film thickness after the development at this time was 4.99 μm and the yield of residual film thickness [(film thickness after development/film thickness before development)×100] was 83.1%.

Moreover, separately, the same photosensitive resin composition varnish was coated on a silicon wafer in the same manner, prebaked and then heated in an oven at 150° C. for 30 minutes, at 250° C. for 30 minutes and at 350° C. for 30 minutes in this order to cure the resin. The coating film obtained was cross-cut in 1-mm width to form 100 squares, and a Cellophane tape was applied to the coating film and then peeled off in order to remove the coating film squares from the silicon wafer. The number of the coating film squares removed (referred to hereinafter as the number of peeled squares after curing) was 0, from which it was confirmed that also the adhesion of the cured film to the wafer was excellent.

Furthermore, the silicon wafer was subjected to pressure cooker treatment (PCT) at 125° C. at 2.3 atm for 100 hours and thereafter, a Cellophane tape was applied thereto and peeled off in the same manner as above to evaluate the adhesion. The number of the coating film squares removed (referred to hereinafter as the number of peeled squares after high temperature-high humidity treatment) was 0, from which it was confirmed that also the adhesion after high temperature-high humidity treatment was excellent. In addition, when the above photosensitive resin composition varnish was stored in a refrigerator at −20° C. for 30 days, deposits and the like were not seen, from which it was confirmed that the photosensitive resin composition varnish had a good storability.

EXAMPLE 18

The same procedure as in Example 17 was repeated, except that the organosilicon compound was replaced by a organosilicon compound represented by the structural formula (S-8):

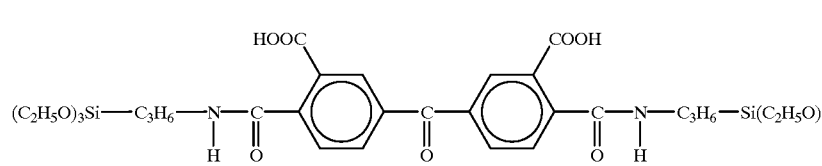

EXAMPLE 19

The same procedure as in Example 17 was repeated, except that the organosilicon compound was replaced by a organosilicon compound represented by the structural formula (S-9):

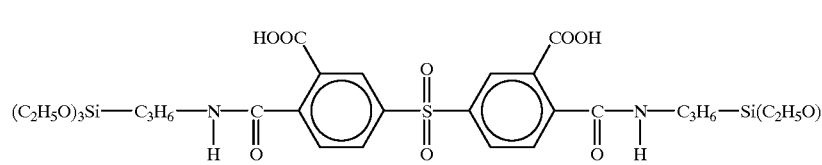

to obtain the results shown in Table 3.

EXAMPLE 20

The same procedure as in Example 17 was repeated, except that the organosilicon compound was replaced by a organosilicon compound represented by the structural formula (S-10):

to obtain the results shown in Table 3.

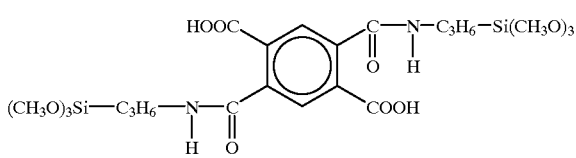
(S-10)

to obtain the results shown in Table 3.

EXAMPLE 21

The same procedure as in Example 17 was repeated, except that the amount of the organosilicon compound (S-7) added was changed to 2 parts by weight, to obtain the results shown in Table 3.

EXAMPLE 22

The same procedure as in Example 17 was repeated, except that the polyamide was replaced by the polyamide (A2) synthesized in Example 5, to obtain the results shown in Table 3.

EXAMPLE 23

The same procedure as in Example 17 was repeated, except that the polyamide was replaced by the polyamide (A3) synthesized in Example 6, to obtain the results shown in Table 3.

EXAMPLE 24

The same procedure as in Example 17 was repeated, except that the polyamide was replaced by the polyamide (A4) synthesized in Example 7 and the diazoquinone was replaced by a diazoquinone represented by the above-mentioned structural formula (Q2), to obtain the results shown in Table 3.

EXAMPLE 25

The same procedure as in Example 17 was repeated, except that the polyamide was replaced by the polyamide (A5) synthesized in Example 8, to obtain the results shown in Table 3.

Comparative Example 17

The same procedure as in Example 17 was repeated, except that the organosilicon compound was not added, to obtain the results shown in Table 3.

Comparative Example 18

The same procedure as in Example 22 was repeated, except that the organosilicon compound was not added, to obtain the results shown in Table 3.

Comparative Example 19

The same procedure as in Example 23 was repeated, except that the organosilicon compound was not added, to obtain the results shown in Table 3.

Comparative Example 20

The same procedure as in Example 17 was repeated, except that the amount of the organosilicon compound added was reduced to 0.05 part by weight, to obtain the results shown in Table 3.

Comparative Example 21

The same procedure as in Example 17 was repeated, except that the amount of the organosilicon compound was increased to 50 parts by weight, to obtain the results shown in Table 3.

Comparative Example 22

The same procedure as in Example 17 was repeated, except that the organosilicon compound was replaced by an organosilicon compound represented by the structural formula (S-11):

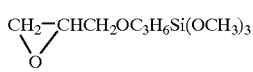
(S-11)

to obtain the results shown in Table 3.

Comparative Example 23

The same procedure as in Example 17 was repeated, except that the organosilicon compound was replaced by an organosilicon compound represented by the structural formula (S-12):

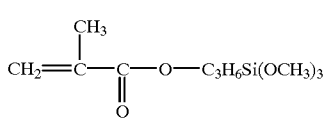
(S-12)

to obtain the results shown in Table 3.

Comparative Example 24

The same procedure as in Example 17 was repeated, except that the organosilicon compound was replaced by an organosilicon compound represented by the structural formula (S-13):

(S-13)

to obtain the results shown in Table 3.

The results of Examples 17–25 and Comparative Examples 17–24 are summarized in Table 3.

TABLE 3

| | Resolution (μm) | Yield of residual film thickness (%) | Adhesion (No. of peeled squares) | | Days until deposits were caused (day) |
|---|---|---|---|---|---|
| | | | After curing | After high temp.-high humidity treatment | |
| Example | | | | | |
| 17 | 5 | 83.1 | 0 | 0 | >30 |
| 18 | 5 | 82.9 | 0 | 0 | 3 |
| 19 | 7 | 81.3 | 0 | 0 | 20 |
| 20 | 6 | 84.5 | 0 | 0 | 15 |
| 21 | 5 | 87.7 | 0 | 0 | >30 |
| 22 | 7 | 90.2 | 0 | 0 | >30 |
| 23 | 9 | 80.0 | 0 | 0 | >30 |
| 24 | 7 | 88.1 | 0 | 0 | >30 |
| 25 | 7 | 87.9 | 0 | 0 | >30 |
| Comparative Example | | | | | |
| 17 | 5 | 88.0 | 100 | 100 | >30 |
| 18 | 6 | 89.4 | 100 | 100 | >30 |
| 19 | 6 | 90.6 | 100 | 100 | >30 |
| 20 | 5 | 87.5 | 45 | 100 | >30 |
| 21 | 20 | 49.1 | 0 | 0 | 20 |
| 22 | 15 | 96.0 | 2 | 100 | >30 |
| 23 | 6 | 87.3 | 100 | 100 | >30 |
| 24 | Since varnish was discolored, evaluation was impossible. | | | | |

EXAMPLE 26

In the same procedure as in Example 1, the synthesis of a polyamide, the preparation of a positive type photosensitive resin composition and the evaluation of characteristics (sensitivity, yield of residual film thickness and shear strength) were conducted.

Subsequently, the positive type photosensitive resin composition obtained above was coated on an element wafer provided with an aluminum circuit on its surface so that the final film thickness became 5 μm, then subjected to pattern processing and finally baked. Subsequently, the product was divided into every chip size and mounted on a lead frame for 16-pin DIP (dual inline package) with an electroconductive paste and then encapsulated with a semiconductor-encapsulating epoxy resin (EME-6300H, a trade name of Sumitomo Bakelite Co., Ltd.) to obtain a 16-pin DIP. The package was treated under the conditions of 85° C./85% humidity for 168 hours, and then immersed in a solder bath at 260° C. for 10 seconds and thereafter subjected to pressure cooker treatment at a high temperature at a high humidity (125° C., 2.3 atm, 100% RH), after which the failure of opening of the aluminum circuit was checked. The results obtained are shown in Table 4.

EXAMPLES 27 to 33

The same procedure as in Example 26 was repeated, except that the positive type photosensitive resin composition was replaced by those shown in Table 4 to obtain the results shown in Table 4.

Comparative Example 25

The same procedure as in Example 26 was repeated, except that the polybenzoxazole resin was not coated on the element surface in the evaluation of reliability of semiconductor device, to obtain the results shown in Table 4.

Comparative Example 26

In the evaluation of resin characteristics in Example 26, the pattern processing was conducted in a film thickness of 30 μm. As a result, even in an exposure dose of 1,000 mJ/cm², the resin remained in the exposed portion after the development and patterning was impossible.

Comparative Example 27

The same procedure as in Example 26 was repeated, except that the positive type photosensitive resin composition was replaced by the positive type photosensitive resin composition obtained in Comparative Example 1, to obtain the results shown in Table 4.

Comparative Example 28

The same procedure as in Example 30 was repeated, except that the phenol compound was not added, to obtain the results shown in Table 4.

Comparative Example 29

The same procedure as in Example 31 was repeated, except that the phenol compound was not added, to obtain the results shown in Table 4.

Comparative Example 30

The same procedure as in Example 26 was repeated, except that the amount of the phenol compound added was reduced to 0.5 part by weight, to obtain the results shown in Table 4.

Comparative Example 31

The same procedure as in Example 26 was repeated, except that the amount of the phenol compound added was increased to 60 parts by weight, to obtain the results shown in Table 4.

Comparative Example 32

The same procedure as in Example 26 was repeated, except that the phenol compound was replaced by a phenol compound represented by the above-mentioned structural formula (P-4), to obtain the results shown in Table 4.

Comparative Example 33

The same procedure as in Example 26 was repeated, except that the phenol compound was replaced by a phenol compound represented by the above-mentioned structural formula (P-5), to obtain the results shown in Table 4.

Comparative Example 34

The same procedure as in Example 26 was repeated, except that the phenol compound was replaced by a phenol compound represented by the above-mentioned structural formula (P-6) to obtain the results shown in Table 4.

The results of Examples 26–33 and Comparative Examples 25–34 are summarized in the following Table 4.

Evaluation of Characteristics

This positive type photosensitive resin composition was coated on a silicon wafer by use of a spin coater and thereafter dried at 70° C. for one hour in an oven to obtain a coating film having a thickness of about 5 $\mu$m. This coating film was exposed to light through a reticle by a g-line stepper exposing machine NSR-1505G3A (a trade name of NIKON CORP.) while changing the exposing portion of the coating film and increasing the exposure dose from 50 mJ/cm$^2$ to 540 mJ/cm$^2$ at a rate of 10 mJ/cm$^2$.

Subsequently, the exposed coating film was immersed in a 0.79% aqueous solution of tetramethylammonium hydroxide for 30 seconds to dissolve and remove the exposed portion and then rinsed with pure water for 30 seconds. As a result, it was confirmed that a pattern was formed in the portion irradiated at an exposure dose of 200 mJ/cm$^2$ or more (namely, the sensitivity was 200 mJ/cm$^2$). The yield of

TABLE 4

| | Photosensitive resin composition | Sensitivity (mJ/cm$^2$) | Yield of residual film thickness (%) | Shear strength (kg/mm$^2$) | Reliability of semiconductor device (No. of failures/20 packages) | |
|---|---|---|---|---|---|---|
| | | | | | PCT 500 hr | PCT 1000 hr |
| Example | | | | | | |
| 26 | Example 1 | 200 | 92.0 | 3.4 | 0/20 | 0/20 |
| 27 | Example 2 | 200 | 88.4 | 3.3 | 0/20 | 0/20 |
| 28 | Example 3 | 180 | 92.4 | 3.2 | 0/20 | 0/20 |
| 29 | Example 4 | 280 | 91.6 | 3.5 | 0/20 | 0/20 |
| 30 | Example 5 | 220 | 93.8 | 3.6 | 0/20 | 0/20 |
| 31 | Example 6 | 260 | 95.7 | 3.5 | 0/20 | 0/20 |
| 32 | Example 7 | 200 | 89.1 | 3.3 | 0/20 | 0/20 |
| 33 | Example 8 | 260 | 94.7 | 3.5 | 0/20 | 0/20 |
| Comparative Example | | | | | | |
| 25 | | — | — | 1.5 | 2/20 | 8/20 |
| 26 | | — | — | — | — | — |
| 27 | | 380 | 92.2 | 2.2 | 1/20 | 2/20 |
| 28 | | 410 | 90.9 | 2.7 | 0/20 | 0/20 |
| 29 | | 440 | 95.3 | 3.0 | 0/20 | 0/20 |
| 30 | | 340 | 92.6 | 2.6 | 0/20 | 1/20 |
| 31 | | 150 | 56.3 | 1.6 | 5/20 | 12/20 |
| 32 | | 360 | 92.8 | 3.1 | 0/20 | 0/20 |
| 33 | | 420 | 96.8 | 3.0 | 0/20 | 0/20 |
| 34 | | 220 | 72.8 | 3.2 | 0/20 | 1/20 |

EXAMPLE 34

Preparation of Positive Type Photosensitive Resin Composition

In 200 parts by weight of N-methylpyrrolidone were dissolved 100 parts by weight of the polyamide (A1) synthesized in Example 1, 25 parts by weight of a diazoquinone represented by the above-mentioned structural formula (Q1), 15 parts by weight of a phenol compound represented by the above-mentioned structural formula (P-1), 2.0 parts by weight of an organosilicon compound represented by the above-mentioned structural formula (S-1) obtained by reacting γ-aminopropyltriethoxysilane with maleic anhydride and 1.0 part by weight of an organosilicon compound represented by the above-mentioned structural formula (S-8) obtained by reacting γ-aminopropyltriethoxysilane with 3,3', 4,4'-benzophenonetetracarboxylic dianhydride, and thereafter, filtered through a 0.2-$\mu$m Teflon filter to obtain a photosensitive resin composition.

residual film thickness at this time [(film thickness after development/film thickness before development)×100] was 91.3% which was a very high value.

Moreover, separately, the same positive type photosensitive resin composition was similarly coated on a silicon wafer, prebaked and thereafter heated in an oven at 150° C. for 30 minutes, at 250° C. for 30 minutes and at 350° C. for 30 minutes in this order to cure the resin.

Furthermore, on the cured film, a semiconductor-encapsulating epoxy resin composition (EME-6300H, a trade name of Sumitomo Bakelite Co., Ltd.) was molded in a size of 2×2×2 mm (width×length×height). Using a tensilometer, the encapsulating epoxy resin composition molded on the cured film of a polybenzoxazole resin was peeled to measure the shear strength. The result thereof was 4.5 kg/mm$^2$.

Subsequently, the above positive type photosensitive resin composition was coated on an element wafer provided with an aluminum circuit on its surface so that the final film thickness became 5 μm, then subjected to pattern processing and finally baked. Subsequently, the product was divided into every chip size and mounted on a lead frame for 16-pin DIP (dual inline package) with an electroconductive paste and then encapsulated with a semiconductor-encapsulating epoxy resin (EME-6300H, a trade name of Sumitomo Bakelite Co., Ltd.) to obtain a 16-pin DIP. The package was treated under the conditions of 85° C./85% humidity for 168 hours, and then immersed in a solder bath at 260° C. for 10 seconds and thereafter subjected to pressure cooker treatment at a high temperature at a high humidity (125° C., 2.3 mentioned structural formula (Q2) and the organosilicon compound was replaced by 1.0 part by weight of an organosilicon compound represented by the structural formula (S-1) obtained by reacting γ-aminopropyltriethoxysilane with maleic anhydride, 0.5 part by weight of an organosilicon compound represented by the above-mentioned structural formula (S-7) obtained by reacting γ-aminopropyltriethoxysilane with 3,3',4,4'-oxydiphthalic dianhydride and 0.5 part by weight of an organosilicon compound represented by the structural (S-14)

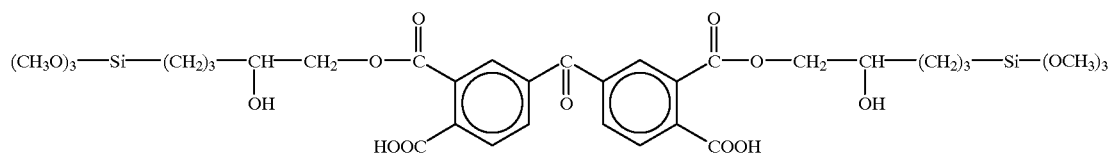

atm, 100% RH), after which the failure of opening of the aluminum circuit was checked. The results obtained are shown in Table 5.

EXAMPLE 35

The same procedure as in Example 34 was repeated, except that the phenol compound was replaced by a phenol compound represented by the above-mentioned structural formula (P-2), to obtain the results shown in Table 5.

EXAMPLE 36

The same procedure as in Example 34 was repeated, except that the phenol compound was replaced by a phenol compound represented by the above-mentioned structural formula (P-3), to obtain the results shown in Table 5.

EXAMPLE 37

The same procedure as in Example 34 was repeated, except that the amount of the phenol compound (P-1) added was changed to 5 parts by weight, to obtain the results shown in Table 5.

EXAMPLE 38

The same procedure as in Example 34 was repeated, except that the polyamide (A1) was replaced by the polyamide (A2) synthesized in Example 5, to obtain the results shown in Table 5.

EXAMPLE 39

The same procedure as in Example 34 was repeated, except that the polyamide (A1) was replaced by the polyamide (A3) synthesized in Example 6 and the organosilicon compound was replaced by an organosilicon compound represented by the above-mentioned structural formula (S-7) obtained by reacting γ-aminopropyltriethoxysilane with 3,3', 4,4'-oxydiphthalic dianhydride, to obtain the results shown in Table 5.

EXAMPLE 40

The same procedure as in Example 34 was repeated, except that the polyamide (A1) was replaced by the polyamide (A4) synthesized in Example 7, the diazoquinone was replaced by a diazoquinone represented by the above-obtained by reacting γ-glycidoxypropyltrimethoxysilane with 3,3',4,4'-benzophenonetetracarboxylic dianhydride, to obtain the results shown in Table 5.

EXAMPLE 41

The same procedure as in Example 34 was repeated, except that the polyamide (A1) was replaced by the polyamide (A5) synthesized in Example 8, to obtain the results shown in Table 5.

EXAMPLE 42

The same procedure as in Example 34 was repeated, except that the phenol compound was not added, to obtain the results shown in Table 5.

EXAMPLE 43

The same procedure as in Example 38 was repeated, except that the phenol compound was not added, to obtain the results shown in Table 5.

EXAMPLE 44

The same procedure as-in Example 39 was repeated, except that the phenol compound was not added, to obtain the results shown in Table 5.

Comparative Example 35

The same procedure for the evaluation of characteristics as in Example 34 was repeated, except that the polybenzoxazole resin was not coated on the element surface, to obtain the results shown in Table 5.

Comparative Example 36

In the evaluation of the resin characteristics in Example 34, a coating film having a thickness of 30 μm was patterned. However, even in an exposure dose of 1,000 mJ/cm², the resin remained in the exposed portion after the development and the patterning was impossible.

Comparative Example 37

The same procedure as in Example 34 was repeated, except that the amount of the phenol compound added was increased to 60 parts by weight, to obtain the results shown in Table 5.

Comparative Example 38

The same procedure as in Example 34 was repeated, except that the amount of the organosilicon compound represented by the above-mentioned structural formula (S-1) obtained by reacting γ-aminopropyltriethoxysilane with maleic anhydride was increased to 15.0 parts by weight, and the amount of the organosilicon compound represented by the above-mentioned structural formula (S-8) obtained by reacting γ-aminopropyltriethoxysilane with 3,3',4,4'-benzophenonetetracarboxylic dianhydride was increased to 10.0 parts by weight, to obtain the results shown in Table 5.

Comparative Example 39

The same procedure as in Example 34 was repeated, except that the phenol compound was replaced by a phenol compound represented by the above-mentioned structural formula (P-4), to obtain the results shown in Table 5.

Comparative Example 40

The same procedure as in Example 34 was repeated, except that the phenol compound was replaced by a phenol compound represented by the above-mentioned structural formula (P-5) to obtain the results shown in Table 5.

The results of Examples 34–44 and Comparative Examples 35–40 are summarized in the following Table 5.

TABLE 5

| | Yield of residual film | | Reliability of semiconductor device (No. of failures/20 packages) | |
|---|---|---|---|---|
| | Sensitivity (mJ/cm$^2$) | thickness (%) | Shear strength (kg/mm$^2$) | PCT 500 hr | PCT 1000 hr |
| Example | | | | | |
| 34 | 200 | 92.0 | 3.4 | 0/20 | 0/20 |
| 35 | 190 | 88.4 | 3.3 | 0/20 | 1/20 |
| 36 | 180 | 92.4 | 3.2 | 0/20 | 0/20 |
| 37 | 250 | 91.6 | 3.5 | 0/20 | 0/20 |
| 38 | 200 | 93.8 | 3.6 | 0/20 | 0/20 |
| 39 | 230 | 95.7 | 3.5 | 0/20 | 0/20 |
| 40 | 180 | 89.1 | 3.3 | 0/20 | 0/20 |
| 41 | 220 | 94.7 | 3.5 | 0/20 | 0/20 |
| 42 | 320 | 93.6 | 3.4 | 0/20 | 1/20 |
| 43 | 330 | 95.1 | 3.2 | 0/20 | 0/20 |
| 44 | 320 | 95.2 | 3.2 | 0/20 | 0/20 |
| Comparative Example | | | | | |
| 35 | — | — | 1.6 | 1/20 | 10/20 |
| 36 | — | — | — | — | — |
| 37 | 140 | 43.0 | 2.2 | 6/20 | 15/20 |
| 38 | 200 | 86.0 | 1.2 | 7/20 | 13/20 |
| 39 | 400 | 94.0 | 4.0 | 0/20 | 0/20 |
| 40 | 250 | 73.0 | 3.6 | 1/20 | 3/20 |

As clear from the above-mentioned Examples, according to this invention, there is obtained a positive type photosensitive resin composition which is excellent in adhesion to an encapsulating resin and a substrate, which has a high sensitivity and which can give a pattern with a high yield of residual film thickness, and there is also obtained a semiconductor device having a high reliability in which a pattern of a polybenzoxazole resin has been formed with a high yield of residual film thickness on a semiconductor element using the positive type photosensitive resin composition excellent in adhesion to an encapsulating resin.

What is claimed is:

1. A semiconductor device in which a film consisting essentially of
   (i) a polybenzoxazole resin represented by the general formula (15):

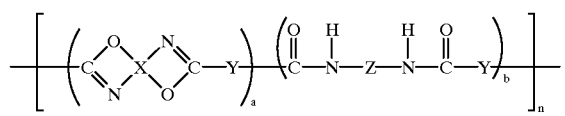

(15)

wherein X represents a tetravalent aromatic group; Y represents a divalent aromatic group; Z represents a divalent group represented by the formula:

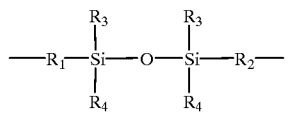

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, and ii) at least one member selected from the group consisting of phenol compounds represented by the general formulas (2) and (3):

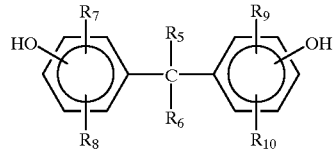

(2)

wherein $R_5$ and $R_6$ represents hydrogen atoms or alkyl groups; and each of $R_7$, $R_8$, and $R_{10}$ represents a hydrogen atom, a hydroxyl group or an alkyl group, and

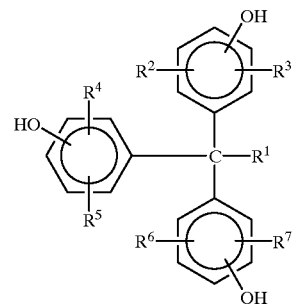

(3)

wherein $R^1$ represents a hydrogen atom or an alkyl group; and each of $R^2$, $R^3$, $R_4$, $R^5$, $R^6$ and $R^7$ represents a hydrogen atom, a halogen atom, a hydroxyl group, an alkyl group or an alicyclic group, is formed in a thickness of 0.1 to 20 μm on a semiconductor element, wherein the film is obtained by coating the semiconductor element with a positive photosensitive resin composition which comprises:

(A) 100 parts by weight of a polyamide represented by the general formula (1):

(1)

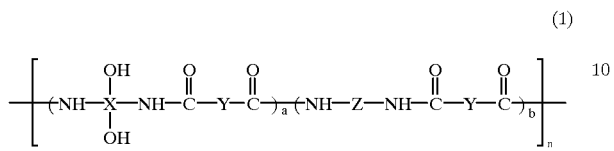

wherein X represents a tetravalent aromatic group; Y represents a divalent aromatic group; Z represents a divalent group represented by the formula

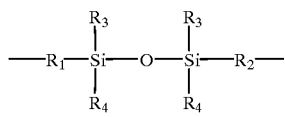

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, (B) 1 to 100 parts by weight of a photosensitive diazoquinone compound, and (C) 1 to 50 parts by weight of at least one member selected from the group consisting of phenol compounds represented by said general formulas (2) and (3), then subjecting the resulting coating film to prebaking, exposing and developing to pattern the same and thereafter heat-curing the patterned coating film.

2. The semiconductor device according to claim 1, wherein the phenol compound (C) is at least one member selected from the group consisting of phenol compounds represented by the general formulas (4) and (5):

(4)

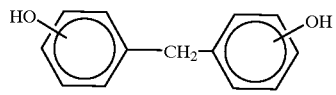

(5)

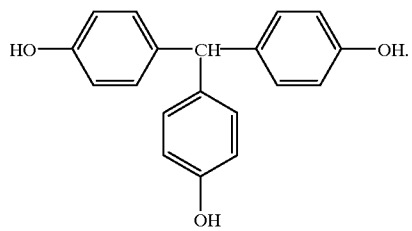

3. The semiconductor device according to claim 1, wherein the phenol compound (C) comprises phenol compounds represented by the structural formulas (6) and (7):

(6)

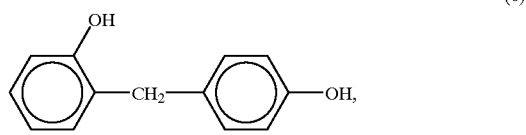

(7)

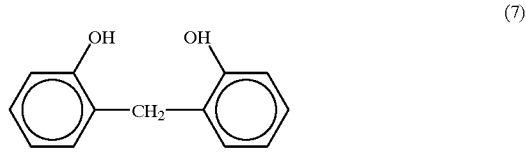

alone or in admixture in a proportion of at least 50% by weight of the phenol compounds (C).

4. The semiconductor device according to claim 1, wherein Y in the general formula (1) is selected from the group consisting of divalent groups represented by the formulas (13):

(13)

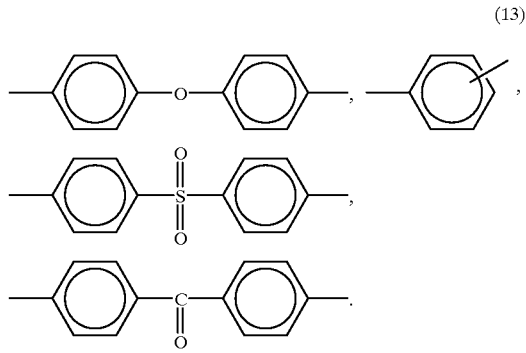

5. The semiconductor device according to claim 1, wherein X in the general formula (1) is selected from the group consisting of tetravalent groups represented by the formulas (12):

(12)

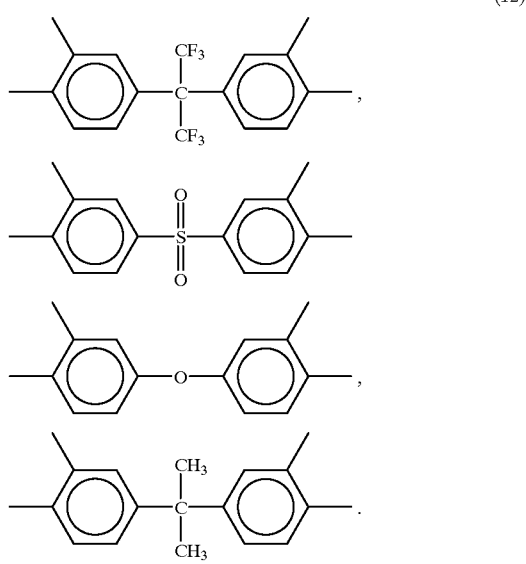

6. The semiconductor device according to claim 1, wherein the photosensitive diazoquinone compound (B) is selected from the group consisting of compounds represented by the general formulas (14):

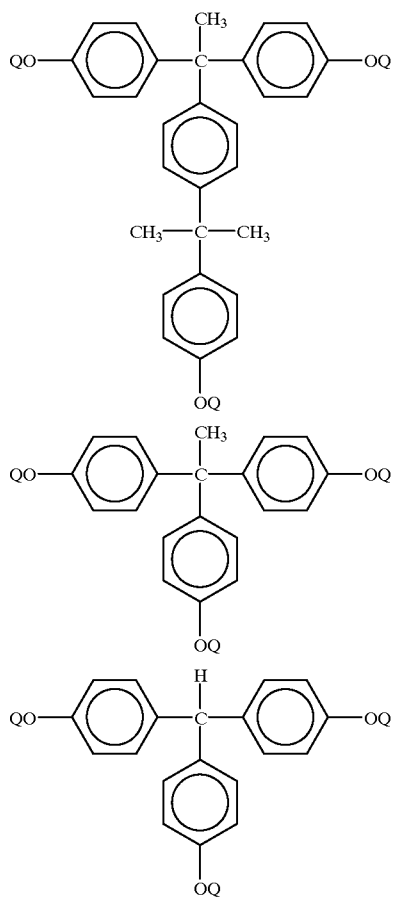

(14)

wherein Q represents a hydrogen atom, or a group represented by the formula:

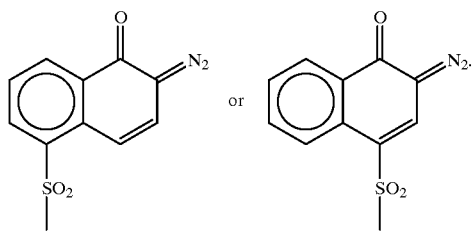

7. A semiconductor device in which a film consisting essentially of (i) a polybenzoxazole resin represented by the general formula (15):

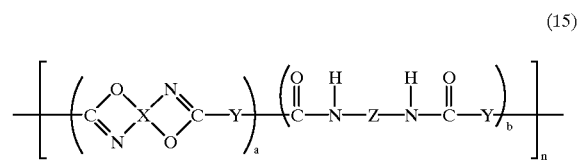

(15)

wherein X represents a tetravalent aromatic group; Y represents a divalent aromatic group; Z represents a divalent group represented by the formula:

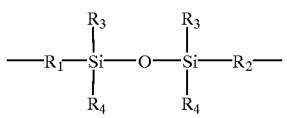

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, and (ii) at least one organosilicon compound selected from the group consisting of compounds represented by the general formulas (8), (9) and (10):

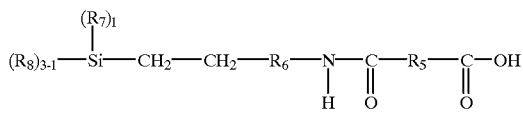

(8)

wherein $R_5$ represents a divalent organic group; $R_6$ represents a divalent organic group; $R_7$ and $R_8$ may be the same as or different from each other and each represents a monovalent organic group; and l represents an integer of 0, 1 or 2,

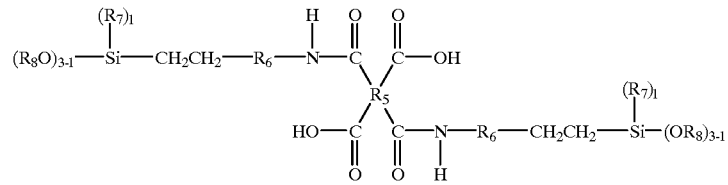

(9)

wherein $R_5$ represents a tetravalent aromatic group; $R_6$ represents a divalent organic group; $R_7$ and $R_8$ may be the same as or different from each other and each represents a monovalent organic group; and l represents an integer of 0, 1 or 2, and

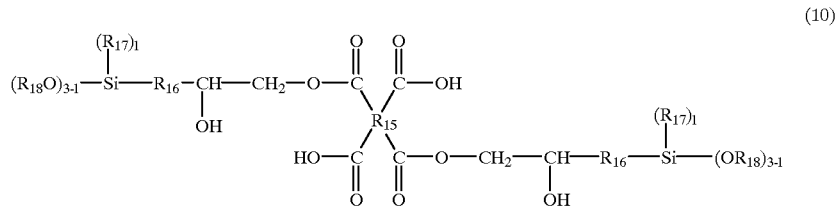

(10)

wherein $R_{15}$ represents a tetravalent aromatic group; $R_{16}$ represents a divalent organic group; $R_{17}$ and $R_{18}$ may be the same as or different from each other and each represents a monovalent organic group; and l represents an integer of 0, 1 or 2, is formed in a thickness of 0.1 to 20 μm on a semiconductor element, wherein the film is obtained by coating the semiconductor element with a positive photosensitive resin composition which comprises:

(A) 100 parts by weight of a polyamide represented by the general formula (1):

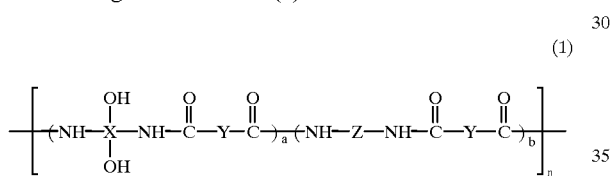

(1)

wherein X represents a tetravalent aromatic group; Y represents a divalent aromatic group; Z represents a divalent group represented by the formula:

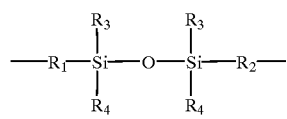

in which $R_1$ and $R_2$ represent divalent organic groups and $R_3$ and $R_4$ represent monovalent organic groups; a and b represents molar fractions; a+b=100 mole %; a=60.0–100.0 mole %; b=0–40.0 mole %; and n represents an integer of 2 to 500, (B) 1 to 100 parts by weight of a photosensitive diazoquinone compound, and (D) 0.1 to 20 parts by weight of at least one organosilicon compound selected from the group consisting of compounds represented by said general formulas (8), (9) and (10), then subjecting the resulting coating film to prebaking, exposing and developing to pattern the same and thereafter heat-curing the patterned coating film.

8. The semiconductor device according to claim 7, wherein $R_5$ in the general formula (8) is —CH=CH—.

9. The semiconductor device according to claim 7, wherein $R_5$ in the general formula (9) is selected from the group consisting of tetravalent groups represented by the following formulas (11):

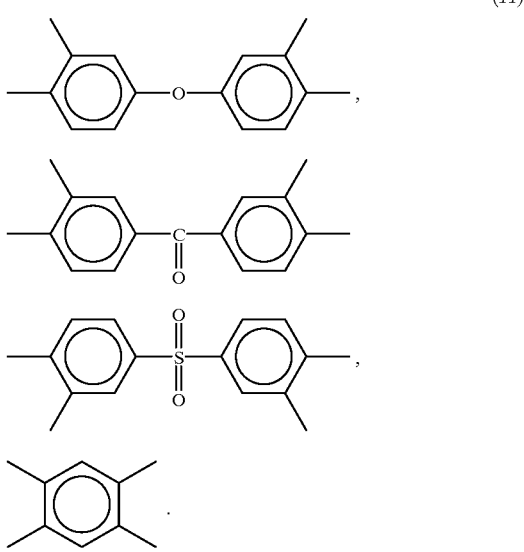

(11)

10. A semiconductor device in which a film consisting essentially of (i) a polybenzoxazole resin represented by the general formula (15):

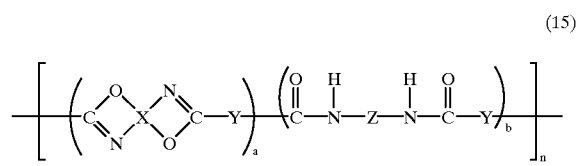

(15)

wherein X represents a tetravalent aromatic group; Y represents a divalent aromatic group; Z represents a divalent group represented by the formula:

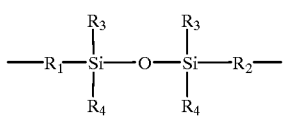

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole % and n represents an integer of 2 to 500, (ii) at least one member selected from the group consisting of phenol compounds represented by the general formulas (2) and (3):

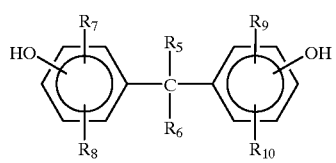
(2)

wherein $R_5$ and $R_6$ represent hydrogen atoms or alkyl groups; and each of $R_7$, $R_8$, $R_9$ and $R_{10}$ represents a hydrogen atom, a hydroxyl group or an alkyl group, and

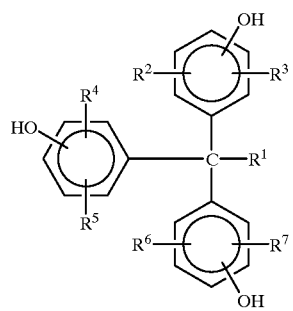
(3)

wherein $R_1$ represents a hydrogen atom or an alkyl group; and each of $R_2$, $R_3$, $R_4$, $R_5$, $R_6$ and $R_7$ represents a hydrogen atom, a halogen atom, a hydroxyl group, an alkyl group of an alicyclic group, and (iii) at least one organosilicon compound selected from the group consisting of compounds represented by the general formulas (8), (9) and (10):

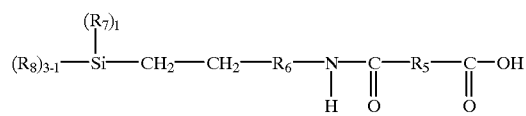
(8)

wherein $R_5$ represents a divalent organic group; $R_6$ represents a divalent organic group; $R_7$ and $R_8$ may be the same as or different from each other and each represents a monovalent organic group; and l represents an integer of 0, 1 or 2, and

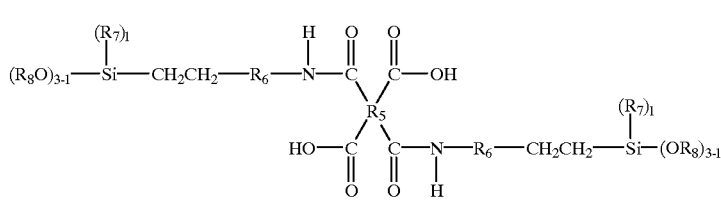
(9)

wherein $R_5$ represents a tetravalent aromatic group; $R_6$ represents a divalent organic group; $R_7$ and $R_8$ may be the same or different from each other and each represents a monovalent organic group; and l represents an integer of 0, 1 or 2, and

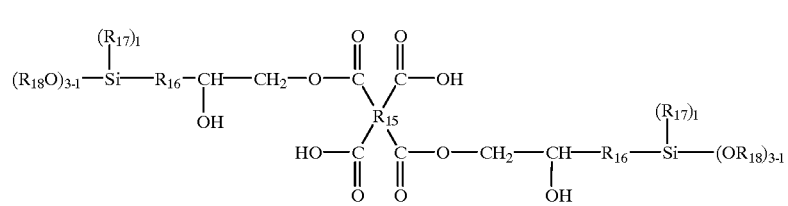
(10)

wherein $R_{15}$ represents a tetravalent aromatic group; $R_{16}$ represents a divalent organic group; $R_{17}$ and $R_{18}$ may be the same as or different from each other and each represents a monovalent organic group; and l represents an integer of 0, 1 or 2 is formed in a thickness of 0.1 to 20 μm on a semiconductor element, wherein the film is obtained by coating the semiconductor element with a positive photosensitive resin composition which comprises:

(A) 100 parts by weight of a polyamide represented by the general formula (1):

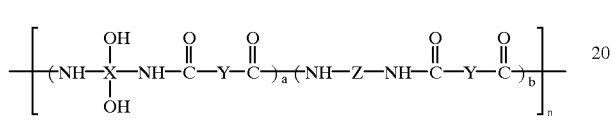

(1)

wherein X represents a tetravalent aromatic group; Y represents a divalent aromatic group; Z represents a divalent group represented by the formula:

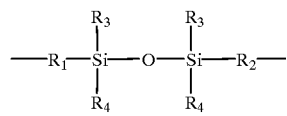

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, (B) 1 to 100 parts by eight of a photosensitive diazoquinone compound, (C) 1 to 50 parts by weight of at least one member selected from the group consisting of phenol compounds represented by said general formulas (2) and (3), and (D) 0.1 to 20 parts by weight of at least one organosilicon compound selected from the group consisting of compounds represented by said general formulas (8), (9) and (10), then subjecting the resulting coating film to prebaking, exposing and developing to pattern the same and thereafter heat-curing the patterned coating film.

11. The semiconductor device according to claim 10, wherein the phenol compound (C) is at least one member selected from the group consisting of phenol compounds represented by the general formulas (4) and (5):

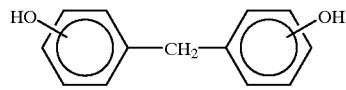

(4)

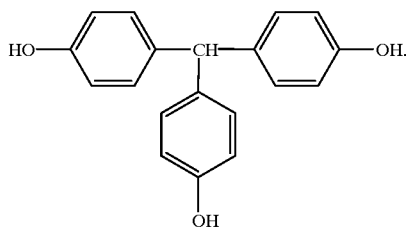

(5)

12. The semiconductor-device according to claim 10, wherein the phenol compound (C) comprises phenol compounds represented by the structural formulas (6) and (7):

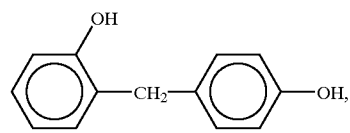

(6)

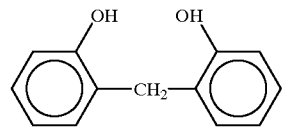

(7)

alone or in admixture in a proportion of at least 50% by weight of the total weight of the phenol compounds (C).

13. A method for making a semiconductor device having a film of a polybenzoxazole resin on a semiconductor element in a thickness of 0.1 to 20 μm, said polybenzoxazole resin having the formula (15):

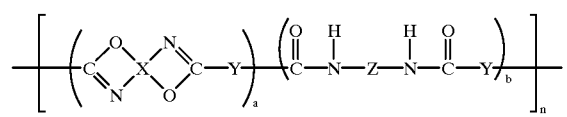

(15)

wherein X represents a tetravalent aromatic group; Y represents a divalent aromatic group; Z represents a divalent group represented by the formula:

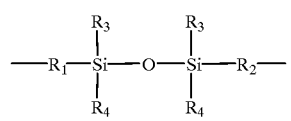

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, said method comprising coating said semiconductor element with a positive photosensitive resin composition which comprises:

(A) 100 parts by weight of a polyamide represented by the general formula (1):

(1)

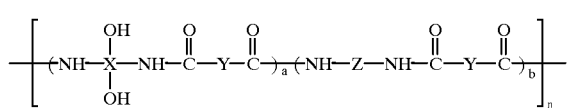

wherein X represents a tetravalent aromatic group; Y represents a divalent aromatic group; Z represents a divalent group represented by the formula:

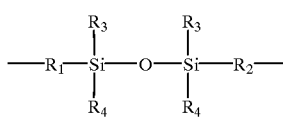

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, (B) 1 to 100 parts by weight of a photosensitive diazoquinone compound, and (C) 1 to 50 parts by weight of at least one member selected from the group consisting of phenol compounds represented by the general formulas (2) and (3):

(2)

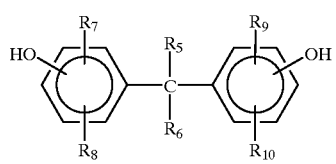

wherein $R_5$ and $R_6$ represent hydrogen atoms or alkyl groups; and each of $R_7$, $R_8$, $R_9$ and $R_{10}$ represents a hydrogen atom, a hydroxyl group or an alkyl group, (3)

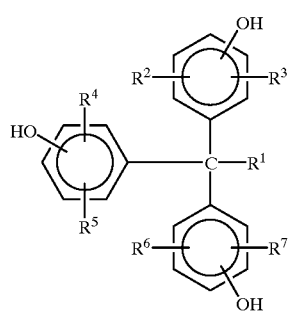

wherein $R^1$ represents a hydrogen atom or an alkyl group; and each of $R^2$, $R^3$, $R^4$, $R^5$, $R^6$ and $R^7$ represents a hydrogen atom, a halogen atom, a hydroxyl group, an alkyl group or an alicyclic group, then subjecting the resulting coating film to prebaking, exposing and developing to pattern the same, and thereafter heat-curing the patterned coating film to obtain said semiconductor device having said film of polybenzoxaxole resin in a thickness of 0.1 to 20 μm on a surface thereof.

14. The method according to claim 13, wherein the phenol compound (C) is at least one member selected from the group consisting of phenol compounds represented by the general formulas (4) and (5):

(4)

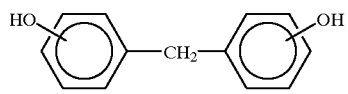

(5)

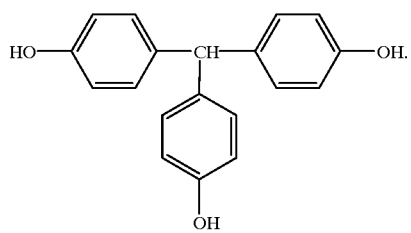

15. The method of claim 13, wherein the phenol compound (C) comprises phenol compounds represented by the structural formulas (6) and (7):

(6)

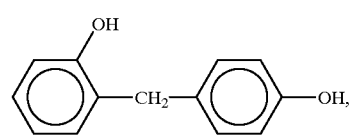

(7)

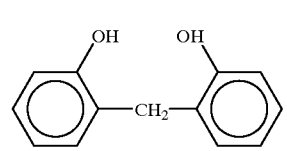

alone or in admixture in a proportion of at least 50% by weight of the total weight of the phenol compounds (C).

16. The method of claim 13, wherein Y in the formula (1) is selected from the group consisting of divalent groups represented by the formulas (13):

(13)

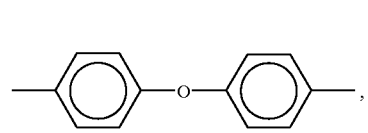

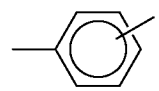

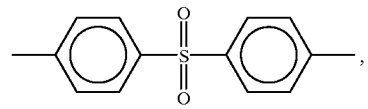

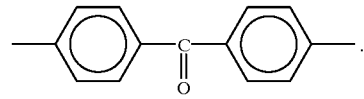

17. The method according to claim 13, wherein X in formula (1) is selected from the group consisting of tetravalent groups represented by the formulas (12):

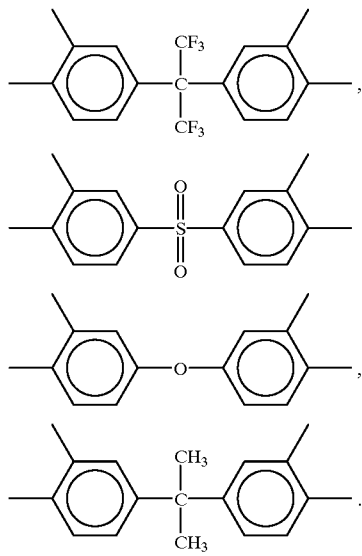

(12)

18. A method for making a semiconductor device having a film of a polybenzoxazole resin on a semiconductor element in a thickness of 0.1 to 20 μm, said polylbenzoxazole resin having the formula (15):

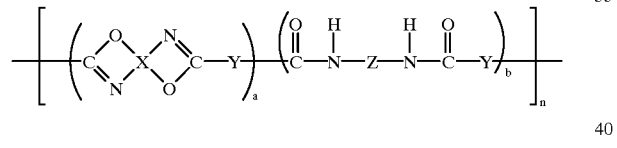

(15)

wherein X represents a tetravalent aromatic group; Y represents a divalent aromatic group; Z represents a divalent group represented by the formula:

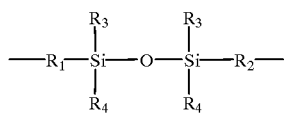

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, said method comprising coating said semiconductor element with a positive photosensitive resin composition which comprises:

(A) 100 parts by weight of a polyamide represented by the general formula (1):

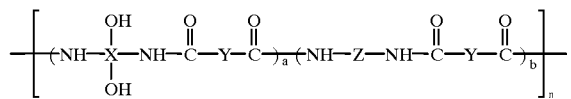

(1)

wherein X represents a tetravalent aromatic group; Y represents a divalent aromatic group; Z represents a divalent group represented by the formula:

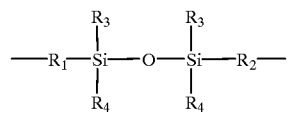

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, (B) 1 to 100 parts by weight of a photosensitive diazoquinone compound, and (D) 0.1 to 20 parts by weight of at least one organosilicon compound selected from the group consisting of compounds represented by the general formulas (8), (9) and (10):

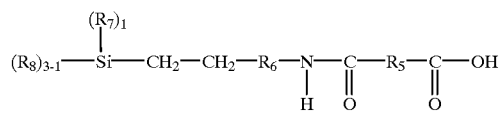

(8)

wherein $R_5$ represents a divalent organic group; $R_6$ represents a divalent organic group; $R_7$ and $R_8$ may be the same as or different from each other and each represents a monovalent organic group; and l represents an integer of 0, 1 or 2,

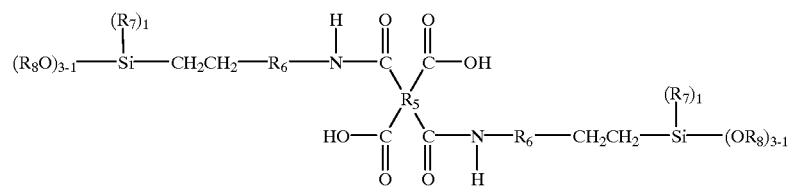

(9)

wherein $R_5$ represents a tetravalent aromatic group; $R_6$ represents a divalent organic group; $R_7$ and $R_8$ may be the same as or different from each other and each represents a monovalent organic group; and l represents an integer of 0, 1 or 2, and

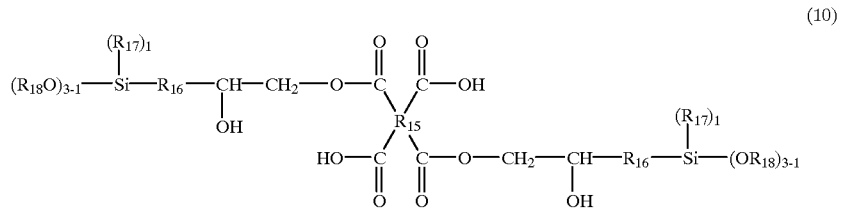

(10)

wherein $R_{15}$ represents a tetravalent aromatic group; $R_{16}$ represents a divalent organic group; $R_{17}$ and $R_{18}$ may be the same as or different from each other and each represents a monovalent organic group; and l represents an integer of 0, 1 or 2, then subjecting the resulting coating film to prebaking, exposing and developing to pattern the same, and thereafter heat-curing the patterned coating film to obtain said semiconductor device having said film of polybenzoxaxole resin in a thickness of 0.1 to 20 μm on a surface thereof.

19. The method of claim 18, wherein $R_5$ in formula (8) is —CH=CH—.

20. The method of claim 18, wherein $R_5$ in the formula (9) is selected from the group consisting of tetravalent groups represented by the following formulas (11):

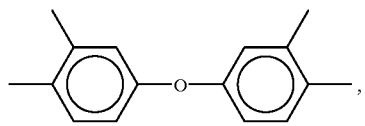

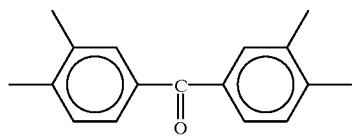

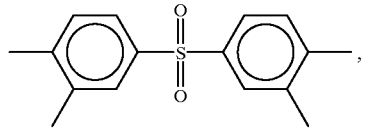

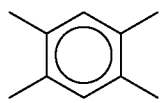

(11)

21. A method for making a semiconductor device having a film of a polybenzoxazole resin on a semiconductor element in a thickness of 0.1 to 20 μm, said polylbenzoxazole resin having the formula (15):

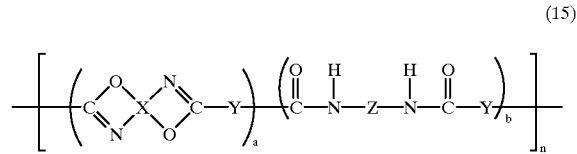

(15)

wherein X represents a tetravalent aromatic group; Y represents a divalent aromatic group; Z represents a divalent group represented by the formula:

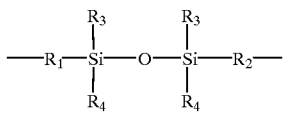

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, said method comprising coating said semiconductor element with a positive photosensitive resin composition which comprises:

(A) 100 parts by weight of a polyamide represented by the general formula (1):

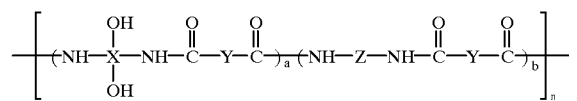

(1)

wherein X represents a tetravalent aromatic group; Y represents a divalent aromatic group; Z represents a divalent group represented by the formula:

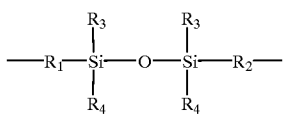

in which $R_1$ and $R_2$ represent divalent organic groups and $R_3$ and $R_4$ represent monovalent organic groups; a and b represent molar fractions; a+b=100 mole %; a=60.0–100.0 mole %; b=0–40.0 mole %; and n represents an integer of 2 to 500, (B) 1 to 100 parts by weight of a photosensitive diazoquinone compound, (C) 1 to 50 parts by weight of at least one member selected from the group consisting of phenol compounds represented by the general formulas (2) and (3):

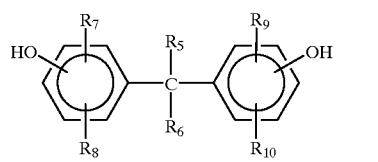

(2)

wherein $R_5$ and $R_6$ represent hydrogen atoms or alkyl groups; and each of $R_7$, $R_8$, $R_9$ and $R_{10}$ represents a hydrogen atom, a hydroxyl group or an alkyl group,

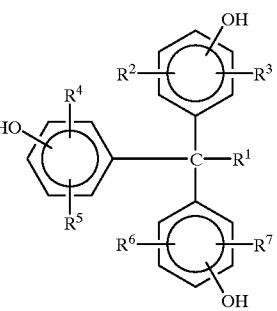

(3)

wherein $R^1$ represents a hydrogen atom or an alkyl group; and each of $R^2$, $R^3$, $R^4$, $R^5$, $R^6$ and $R^7$ represents a hydrogen atom, a halogen atom, a hydroxyl group, an alkyl group or an alicyclic group, and (D) 0.1 to 20 parts by weight of at least one organosilicon compound selected from the group consisting of compounds represented by the general formulas (8), (9) and (10):

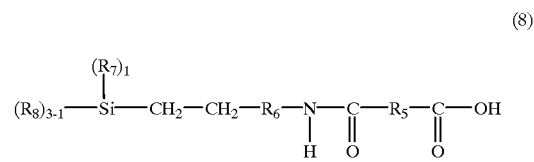

(8)

wherein $R_5$ represents a divalent organic group; $R_6$ represents a divalent organic group; $R_7$ and $R_8$ may be the same as or different from each other and each represents a monovalent organic group; and l represents an integer of 0, 1 or 2,

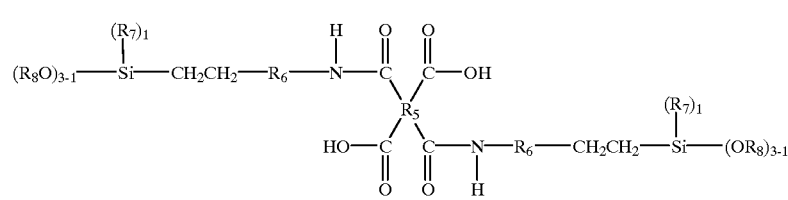

(9)

wherein $R_5$ represents a tetravalent aromatic group; $R_6$ represents a divalent organic group; $R_7$ and $R_8$ may be the same as or different from each other and each represents a monovalent organic group; and l represents an integer of 0, 1 or 2, and

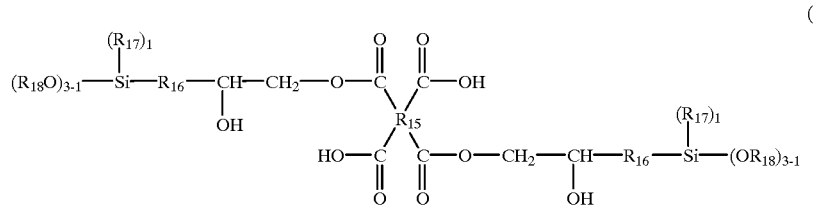

(10)

wherein $R_{15}$ represents a tetravalent aromatic group; $R_{16}$ represents a divalent organic group; $R_{17}$ and $R_{18}$ may be the same as or different from each other and each represents a monovalent organic group; and l represents an integer of 0, 1 or 2, then subjecting the resulting coating film to prebaking, exposing and developing to pattern the same, and thereafter heat-curing the patterned coating film to obtain said semiconductor device having said film of polybenzoxaxole resin in a thickness of 0.1 to 20 μm on a surface thereof.

22. The method of claim 21, wherein the phenol compound (C) is at least one member selected from the group consisting of phenol compounds represented by the general formulas (4) and (5):

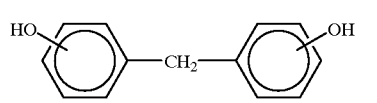
(4)

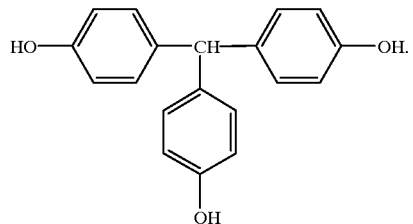
(5)

23. The method of claim 21, wherein the phenol compound (C) comprises phenol compounds represented by the structural formulas (6) and (7):

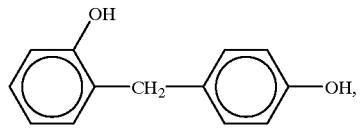
(6)

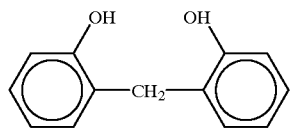
(7)

alone or in admixture in a proportion of at least 50% by weight of the total weight of the phenol compounds (C).

24. The method of claim 13, wherein the photosensitive diazoquinone compound (B) is selected from the group consisting of compounds represented by the general formulas (14):

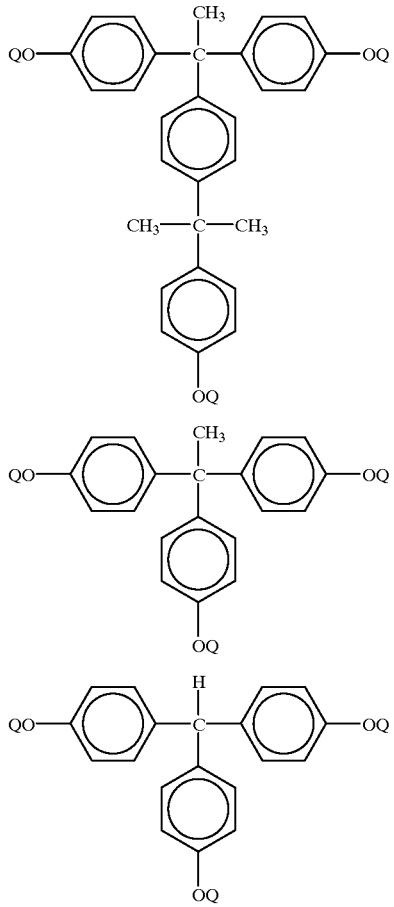
(14)

wherein Q represents a hydrogen atom, or a group represented by the formula:

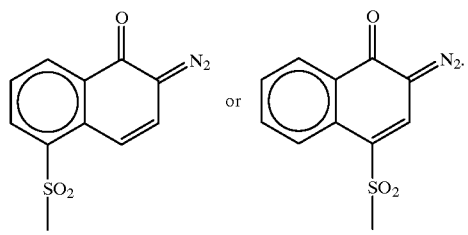

* * * * *